United States Patent
Chen et al.

(10) Patent No.: US 11,695,502 B2
(45) Date of Patent: Jul. 4, 2023

(54) PACKET PROCESSING METHOD AND APPARATUS, AND CHIP

(71) Applicant: Huawei Technologies Co., Ltd., Shenzhen (CN)

(72) Inventors: Qing Chen, Shenzhen (CN); Jiyuan Shi, Nanjing (CN); Jie Chen, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/684,729

(22) Filed: Mar. 2, 2022

(65) Prior Publication Data
US 2022/0190956 A1 Jun. 16, 2022

Related U.S. Application Data

(63) Continuation of application No. PCT/CN2020/114586, filed on Sep. 10, 2020.

(30) Foreign Application Priority Data

Sep. 10, 2019 (CN) .......................... 201910854367.2
Nov. 29, 2019 (CN) .......................... 201911205835.X

(51) Int. Cl.
*H04L 1/00* (2006.01)
*H03M 13/03* (2006.01)
*H04L 49/55* (2022.01)

(52) U.S. Cl.
CPC .......... *H04L 1/0041* (2013.01); *H03M 13/03* (2013.01); *H04L 1/0045* (2013.01); *H04L 49/557* (2013.01)

(58) Field of Classification Search
CPC ... H04L 1/0041; H04L 1/0045; H04L 49/557; H04L 1/004; H03M 13/03; H03M 13/15; H03M 13/152; H03M 13/1515
See application file for complete search history.

(56) References Cited

U.S. PATENT DOCUMENTS 8,839,078 B2   9/2014 Abu-Surra et al.
9,417,945 B2   8/2016 Authement et al.
(Continued)

FOREIGN PATENT DOCUMENTS

CN   101911613 A   12/2010
CN   102356585 A   2/2012
(Continued)

OTHER PUBLICATIONS

Brokalakis et al., Using hardware-based forward error correction to reduced the overall energy consumption of WSN's, IEEE, Wireless Communications and Networking conference: mobile and wireless networks, pp. 2101-2106. (Year: 2012).*
(Continued)

*Primary Examiner* — Shelly A Chase
(74) *Attorney, Agent, or Firm* — Conley Rose, P.C.

(57) ABSTRACT

A packet processing method includes generating, by a processor of a network device, a first encoding task based on M original packets in a to-be-processed first data stream, where M is a positive integer, and where the first encoding task instructs to encode the M original packets; and performing, by a target hardware engine of the network device and based on the first encoding task, forward error correction (FEC) encoding on the M original packets to obtain R redundant packets, where R is a positive integer.

20 Claims, 13 Drawing Sheets

(56) References Cited

U.S. PATENT DOCUMENTS

| | | |
|---|---|---|
| 2005/0138268 A1 | 6/2005 | Gemmell |
| 2012/0230300 A1* | 9/2012 | Goerke ............... H04W 28/18 370/335 |
| 2013/0275776 A1* | 10/2013 | Baptist ............... H04L 63/0428 713/193 |
| 2014/0164883 A1 | 6/2014 | Xiang |
| 2016/0294508 A1 | 10/2016 | Takeuchi et al. |

FOREIGN PATENT DOCUMENTS

| | | |
|---|---|---|
| CN | 102595252 A | 7/2012 |
| CN | 103533453 A | 1/2014 |
| CN | 105933342 A | 9/2016 |
| JP | 2000134619 A | 5/2000 |
| JP | 2000341336 A | 12/2000 |
| JP | 2008028767 A | 2/2008 |
| JP | 2009538012 A | 10/2009 |
| JP | 2010183450 A | 8/2010 |
| JP | 2013521695 A | 6/2013 |
| JP | 2016510524 A | 4/2016 |
| JP | 2015163094 A1 | 4/2017 |
| WO | 2010124651 A1 | 11/2010 |
| WO | 2014054101 A1 | 4/2014 |
| WO | 2015163094 A1 | 10/2015 |

OTHER PUBLICATIONS

Watson, M., "Forward Error Correction (FEC) Building Block," RFC 5052, Aug. 2007, 25 pages.

Li, A., Ed., "RTP Payload Format for Generic Forward Error Correction," RFC 5109, Dec. 2007, 44 pages.

Watson, M., et al., "Forward Error Correction (FEC) Framework," RFC 6363, Oct. 2011, 42 pages.

\* cited by examiner

PACKET PROCESSING METHOD AND APPARATUS, AND CHIP

CROSS-REFERENCE TO RELATED APPLICATIONS

This is a continuation of International Patent Application No. PCT/CN2020/114586 filed on Sep. 10, 2020, which claims priority to Chinese Patent Application No. 201911205835.X filed on Nov. 29, 2019 and Chinese Patent Application No. 201910854367.2 filed on Sep. 10, 2019. All of the aforementioned patent applications are hereby incorporated by reference in their entireties.

TECHNICAL FIELD

This application relates to the field of data encoding technologies, and in particular, to a packet processing method and apparatus, and a chip.

BACKGROUND

When a data stream is transmitted between two network devices, a packet loss often occurs. A forward error correction (FEC) encoding and decoding technology may be used to resolve a packet loss problem in a data stream transmission process.

To be specific, a first-level network device performs FEC encoding on original packets in the data stream to obtain redundant packets of the original packets. The first-level network device adds an FEC packet header to each of the original packets and each of the redundant packets, and sends the original packets that carry the FEC packet headers and the redundant packets that carry the FEC packet headers to a second-level network device. When original packets are lost in the transmission process, the second-level network device recovers the lost original packets based on original packets that are not lost and the redundant packets, combines the original packets that are not lost and the recovered original packets into the original data stream, and outputs the data stream. This avoids the packet loss in the data stream transmission process.

Both an FEC encoding process and an original packet recovery process in a foregoing packet transmission process require a large amount of computation, and the computation is completed by a central processing unit (CPU) of a network device. However, a computing capability and a computing rate of the CPU are limited. If a requirement of fast encoding and decoding is to be met, it is difficult to meet a requirement of a large throughput in the packet transmission process.

SUMMARY

This application provides a packet processing method and apparatus, and a chip, so that a network device quickly performs packet encoding and decoding processing while meeting a requirement of a large throughput in a packet transmission process.

According to a first aspect, a packet processing method is provided, where the method is applied to a network device including a processor and a target hardware engine. The method includes the following. The processor generates a first encoding task based on M original packets in a to-be-processed first data stream, where M is a positive integer, and the first encoding task is used to indicate to encode the M original packets. The target hardware engine performs FEC encoding on the M original packets based on the first encoding task to obtain R redundant packets, where R is a positive integer.

In this method, FEC encoding is directly performed on the M original packets in the first data stream in the target hardware engine of the network device rather than in the processor. Therefore, CPU overheads can be reduced, and encoding efficiency of the network device can be improved. In this way, the network device can easily meet a requirement of a large throughput in a packet transmission process.

In a possible implementation, after the processor generates the first encoding task based on the M original packets in the to-be-processed first data stream, the method further includes the following. The processor stores the first encoding task in a first target sending queue, where the first target sending queue is used to store encoding tasks of to-be-processed data streams of the network device, and the to-be-processed data streams of the network device include the first data stream. The target hardware engine reads the first encoding task from the first target sending queue.

In a possible implementation, that the processor stores the first encoding task in a first target sending queue includes the following. The processor adds the first encoding task to the first target sending queue based on a priority of the first data stream, where a priority of the first target sending queue is equal to the priority of the first data stream.

In a possible implementation, that the target hardware engine reads the first encoding task from the first target sending queue includes the following. The target hardware engine sequentially queries, based on a priority sequence of sending queues, whether there are encoding tasks in each of the sending queues, where each of the sending queues corresponds to one priority. The target hardware engine reads the first encoding task from the first target sending queue when there is no encoding task in a queue whose priority is higher than that of the first target sending queue in the sending queues.

In a possible implementation, the first target sending queue is located in any one of a memory, the processor, and the target hardware engine of the network device.

In a possible implementation, before the processor generates the first encoding task based on the M original packets in the to-be-processed first data stream, the method further includes the following. The network device stores received original packets in the first data stream in the memory of the network device. If a quantity of unencoded original packets in the first data stream in the memory of the network device is greater than or equal to M, the processor obtains the M original packets from the unencoded original packets in the first data stream.

In a possible implementation, the first encoding task includes storage addresses of the M original packets, or the first encoding task includes storage addresses of the M original packets and the priority of the first data stream, or the first encoding task includes the M original packets, or the first encoding task includes the M original packets and the priority of the first data stream.

According to a second aspect, a packet processing method is provided, where the method is applied to a network device including a processor and a target hardware engine. The method includes the following. The processor obtains a first group of FEC packets from a received first data stream, where all FEC packets in the first group of FEC packets have a same FEC packet header, and the FEC packet header includes an FEC-encoding original packet quantity M. When a quantity of original packets in the first group of FEC packets is less than the original packet quantity M, the processor generates a first decoding task based on the first group of FEC packets, where the first decoding task is used to indicate to decode the first group of FEC packets. The target hardware engine performs FEC decoding on the original packets in the first group of FEC packets and redundant packets of the original packets based on the first decoding task, to obtain lost original packets in the first group of FEC packets.

In this method, FEC decoding is directly performed on FEC packets that are not lost in the first group of FEC packets in the target hardware engine of the network device rather than in a CPU. Therefore, CPU overheads can be reduced, and decoding efficiency of the network device can be improved. In this way, the network device can easily meet a requirement of a large throughput in a packet transmission process.

In a possible implementation, after the processor generates the first decoding task based on the first group of FEC packets, the method further includes the following. The processor stores the first decoding task in a second target sending queue, where the second target sending queue is used to store decoding tasks of to-be-processed data streams of the network device, and the to-be-processed data streams of the network device include the first data stream. The target hardware engine reads the first decoding task from the second target sending queue.

In a possible implementation, that the processor stores the first decoding task in a second target sending queue includes the following. The processor adds the first decoding task to the second target sending queue based on a priority of the first data stream, where a priority of the second target sending queue is equal to the priority of the first data stream.

In a possible implementation, that the target hardware engine reads the first decoding task from the second target sending queue includes the following. The target hardware engine sequentially queries, based on a priority sequence of sending queues, whether there are decoding tasks in each of the sending queues, where each of the sending queues corresponds to one priority. The target hardware engine reads the first decoding task from the second target sending queue when there is no other decoding task in a queue whose priority is higher than that of the second target sending queue in the sending queues.

In a possible implementation, the second target sending queue is located in any one of a memory, the processor, and the target hardware engine of the network device.

In a possible implementation, the first decoding task includes storage addresses of the first group of FEC packets, or the first decoding task includes storage addresses of the first group of FEC packets and the priority of the first data stream, or the first decoding task includes the first group of FEC packets, or the first decoding task includes the first group of FEC packets and the priority of the first data stream.

According to a third aspect, a packet processing apparatus is provided configured to perform the foregoing packet processing method. Further, the apparatus includes a function module configured to perform the packet processing method provided in the first aspect or any optional manner of the first aspect.

According to a fourth aspect, a packet processing apparatus is provided configured to perform the foregoing packet processing method. Further, the apparatus includes a function module configured to perform the packet processing method provided in the second aspect or any optional manner of the second aspect.

According to a fifth aspect, a chip is provided, where the chip includes a processor and a target hardware engine. The processor is the processor configured to implement the packet processing method provided in the first aspect or any optional manner of the first aspect, and the target hardware engine is the target hardware engine configured to implement the packet processing method provided in the first aspect or any optional manner of the first aspect.

According to a sixth aspect, a chip is provided, where the chip includes a processor and a target hardware engine. The processor is the processor configured to implement the packet processing method provided in the second aspect or any optional manner of the second aspect, and the target hardware engine is the target hardware engine configured to implement the packet processing method provided in the second aspect or any optional manner of the second aspect.

BRIEF DESCRIPTION OF DRAWINGS

To describe technical solutions in some of the embodiments of this application more clearly, the following briefly describes accompanying drawings for describing some of the embodiments. It is clear that the accompanying drawings in the following descriptions show merely some embodiments of this application, and a person of ordinary skill in the art may further derive other accompanying drawings from these accompanying drawings without creative efforts.

DESCRIPTION OF EMBODIMENTS

To make objectives, technical solutions, and advantages of this application clearer, the following further describes implementations of this application in detail with reference to accompanying drawings.

Figure 1:
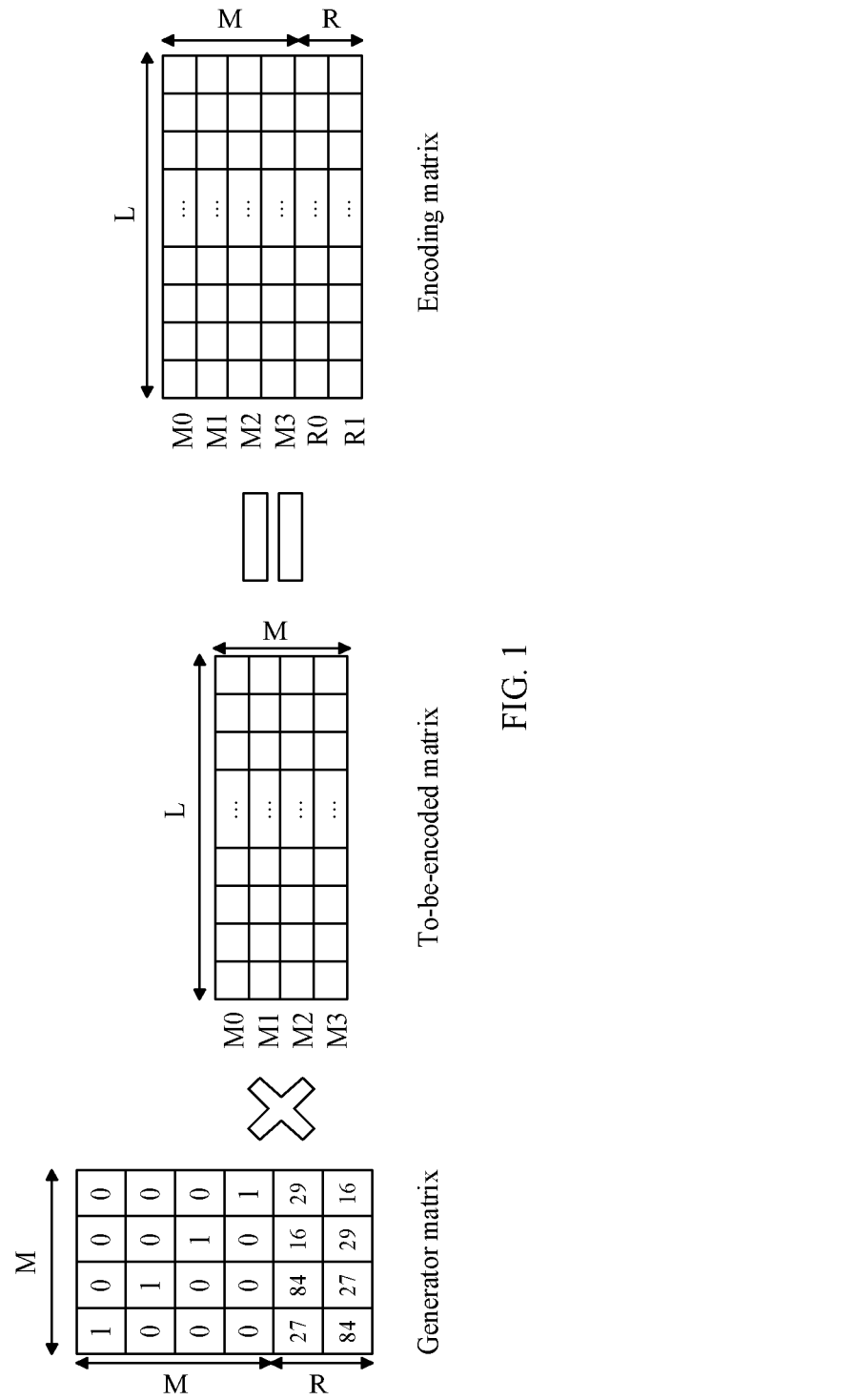
FIG. 1 is a schematic diagram of an FEC encoding process according to an embodiment of this application.

For ease of understanding an implementation process of this application, with reference to a schematic diagram of an FEC encoding process according to an embodiment of this application shown in FIG. 1, FEC encoding is described as follows. Parameters used in the FEC encoding process are encoding parameters. The encoding parameters include an original packet quantity M, a redundant packet quantity R, and a target size L, where both M and R are positive integers, L is a value greater than 0, the original packet quantity M is a quantity of to-be-encoded original packets, and the redundant packet quantity R is a quantity of redundant packets obtained after FEC encoding is performed on the M original packets. Because sizes of the M original packets are different, in a process of encoding the M original packets to generate the redundant packets, a first network device first performs padding processing based on the M original packets to obtain M equal-length packets, where each of the equal-length packets is a packet obtained after one original packet is padded. A size of each of the equal-length packets and a size of each of the redundant packets are both the target size L, and the target size L may be a size of a largest original packet in the M original packets. In this case, the largest packet in the M original packets does not need to be padded, and may be considered as an equal-length packet. Then, the first network device may first form an M×L to-be-encoded matrix by using the M equal-length packets, where each row of the to-be-encoded matrix is one equal-length packet. For example, M=4, and four equal-length packets, namely, M0 to M3, are shown in FIG. 1. In this case, the to-be-encoded matrix is formed by the equal-length packets M0 to M3. The first network device constructs an (M+R)×M generator matrix, where the generator matrix includes a first submatrix and a second submatrix, the first submatrix is an M×M identity matrix, and the second submatrix is an R×M Cauchy matrix.

An element in the $i^{th}$ row and the $j^{th}$ column in the second submatrix is $$\frac{1}{x_{i-1} + y_{j-1}}. \quad x_{i-1} \text{ and } y_{j-1}$$

are elements in a Galois field (GF) ($2^w$), where i and j are integers greater than or equal to 0, and w may be 8. For example, a generator matrix is shown in FIG. 1. The first network device performs multiplication calculation on the generator matrix and the to-be-encoded matrix to obtain an (M+R)×L encoding matrix, where the encoding matrix includes the to-be-encoded matrix and an R×L check matrix, and each row of the check matrix is one redundant packet. For example, in FIG. 1, when R=2, redundant packets are R0 and R1.

After obtaining the R redundant packets, the first network device adds a same FEC packet header to the M original packets and the R redundant packets, to encapsulate the M original packets and the R redundant packets into a group of FEC packets, and sends the group of FEC packets to a second network device. When any equal-length packet of the group of FEC packets in the encoding matrix is lost in a transmission process, the second network device may further recover the any lost equal-length packet by using a decoding process. With reference to a schematic diagram of an FEC decoding process according to an embodiment of this application shown in FIG. 2, FEC decoding is described as follows. When the equal-length packets M2 and M3 in the encoding matrix are lost, the second network device may form a recovery matrix by using the equal-length packets M0 and M1 that are not lost and the redundant packets R0 and R1. Then, the second network device constructs a target check matrix, where the target check matrix includes a third submatrix and the second submatrix. Because the two equal-length packets are lost, the third submatrix is a 2×M identity matrix. The second network device may obtain the to-be-encoded matrix by multiplying an inverse matrix of the target check matrix by the recovery matrix, and obtain the lost equal-length packets M2 and M3 from the to-be-encoded matrix.

Figure 3:
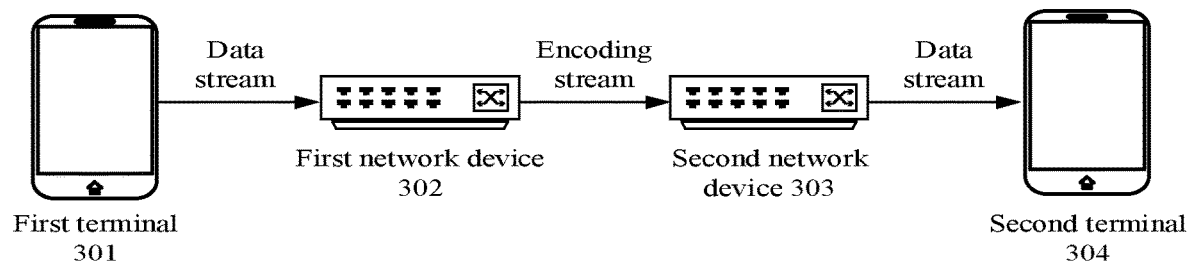
FIG. 3 is a schematic diagram of a packet transmission system according to an embodiment of this application.

FIG. 3 is a schematic diagram of a packet transmission system according to an embodiment of this application. Refer to FIG. 3. The packet transmission system includes a first terminal 301, a first network device 302, a second network device 303, and a second terminal 304. The first terminal 301 is configured to generate a data stream, and send the data stream to the first network device 302. The first network device 302 may perform FEC encoding on packets in the data stream, and send an encoding stream including FEC packets to the second network device 303. The second network device 303 decodes FEC packets that are not lost in the encoding stream to recover lost original packets, forms the original data stream by using the recovered original packets and the original packets that are not lost, and sends the data stream to the second terminal 304. The first terminal 301 and the second terminal 304 each may be a mobile phone, a notebook computer, or the like, the first network device 302 and the second network device 303 each may be a computer device, for example, a router or a switch, and the data stream may be a video stream, or may be a text stream including text data. A type of the data stream is not limited in this embodiment of this application.

In a schematic diagram using the video stream as an example, when the first terminal 301 performs a video session with a plurality of second terminals 304, the first terminal 301 sends original packets used to compose videos to the first network device 302, to form video streams (i.e., data streams). The first network device 302 performs FEC encoding on original packets in the video streams to obtain redundant packets, encapsulates the original packets and the redundant packets into FEC packets to obtain encoding streams, and sends the encoding streams to the second network device 303. After obtaining each group of FEC packets in the encoding streams, the second network device 303 determines whether original packets are lost in each group of FEC packets based on an FEC packet header of each group of FEC packets. If the original packets are lost, the second network device 303 decodes a group of FEC packets in which the original packets are lost to recover the lost original packets, forms the video streams by using the recovered original packets and original packets that are not lost, and sends the video streams to the plurality of second terminals 304. After receiving the video streams, each of the second terminals 304 plays the video, thereby implementing the video session between the plurality of terminals.

Figure 4:
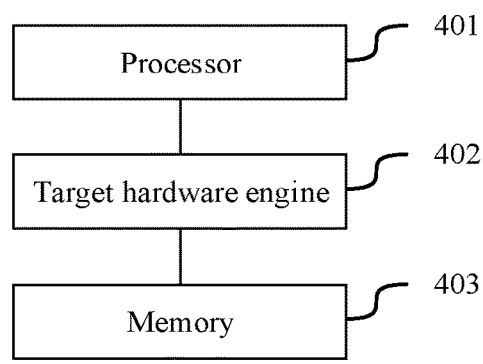
FIG. 4 is a schematic diagram of a structure of a packet processing apparatus according to an embodiment of this application.

In some possible implementations, the first terminal 301 may further have a function of the first network device. FIG. 4 is a schematic diagram of a structure of a packet processing apparatus 400 according to an embodiment of this application. The apparatus 400 includes a processor 401 configured to generate a first encoding task based on M original packets in a to-be-processed first data stream, where M is a positive integer, and the first encoding task is used to indicate to encode the M original packets, and a target hardware engine 402 configured to perform FEC encoding on the M original packets based on the first encoding task to obtain R redundant packets, where R is a positive integer.

Optionally, the processor 401 is further configured to store the first encoding task in a first target sending queue, where the first target sending queue is used to store encoding tasks of to-be-processed data streams of the apparatus, and the to-be-processed data streams of the apparatus include the first data stream.

The target hardware engine is further configured to read the first encoding task from the first target sending queue.

Optionally, the processor 401 is configured to add the first encoding task to the first target sending queue based on a priority of the first data stream, where a priority of the first target sending queue is equal to the priority of the first data stream.

Optionally, the target hardware engine 402 is configured to sequentially query, based on a priority sequence of sending queues, whether there are encoding tasks in each of the sending queues, where each of the sending queues corresponds to one priority, and read the first encoding task from the first target sending queue when there is no encoding task in a queue whose priority is higher than that of the first target sending queue in the sending queues.

Optionally, the apparatus 400 further includes a memory 403, and the first target sending queue is located in any one of the memory, the processor, and the target hardware engine of the network device.

The memory 403 is configured to store received original packets in the first data stream.

The processor 401 is further configured to, if a quantity of unencoded original packets in the first data stream in the memory is greater than or equal to M, obtain the M original packets from the unencoded original packets in the first data stream and perform a step of generating the first encoding task based on the M original packets in the to-be-processed first data stream.

The processor 401 may be a general-purpose processor, for example, a CPU, a network processor (NP), or a combination of a CPU and an NP. The processor may further include a hardware chip. The hardware chip may be an application-specific integrated circuit (ASIC), a programmable logic device (PLD), or a combination thereof. The PLD may be a complex PLD (CPLD), a field-programmable gate array (FPGA), generic array logic (GAL), or any combination thereof.

The memory 403 may include a volatile memory, for example, a random-access memory (RAM). The memory may alternatively include a non-volatile memory, for example, a flash memory, a hard disk drive (HDD), and a solid-state drive (SSD). The memory may alternatively include any combination of the foregoing types of memories.

Optionally, the first encoding task includes storage addresses of the M original packets, or the first encoding task includes storage addresses of the M original packets and the priority of the first data stream, or the first encoding task includes the M original packets, or the first encoding task includes the M original packets and the priority of the first data stream.

In some possible implementations, a function of the packet processing apparatus shown in FIG. 4 may be alternatively implemented by using a chip, and the chip may include the processor 401 in FIG. 4 and the target hardware engine 402 in FIG. 4.

Figure 5:
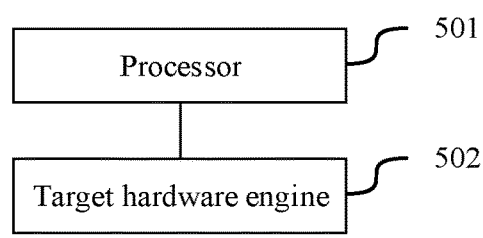
FIG. 5 is a schematic diagram of a structure of a packet processing apparatus according to an embodiment of this application.

In some possible implementations, the second terminal 304 may further have a function of the second network device 303. FIG. 5 is a schematic diagram of a structure of a packet processing apparatus 500 according to an embodiment of this application. The apparatus 500 includes a processor 501 and a target hardware engine 502.

The processor 501 is configured to obtain a first group of FEC packets from a received first data stream, where FEC packet headers of all FEC packets in the first group of FEC packets are the same, and the FEC packet header includes an FEC-encoding original packet quantity M, and when a quantity of original packets in the first group of FEC packets is less than the original packet quantity M, generate a first decoding task based on the first group of FEC packets, where the first decoding task is used to indicate to decode the first group of FEC packets.

The target hardware engine 502 is configured to perform FEC decoding on the original packets in the first group of FEC packets and redundant packets of the original packets based on the first decoding task, to obtain lost original packets in the first group of FEC packets.

Optionally, the processor 501 is further configured to store the first decoding task in a second target sending queue, where the second target sending queue is used to store decoding tasks of to-be-processed data streams of the apparatus, and the to-be-processed data streams of the apparatus include the first data stream.

The target hardware engine 502 is further configured to read the first decoding task from the second target sending queue.

Optionally, the processor 501 is configured to add the first decoding task to the second target sending queue based on a priority of the first data stream, where a priority of the second target sending queue is equal to the priority of the first data stream.

Optionally, the target hardware engine 502 is configured to sequentially query, based on a priority sequence of sending queues, whether there are decoding tasks in each of the sending queues, where each of the sending queues corresponds to one priority, and read the first decoding task from the second target sending queue when there is no other decoding task in a queue whose priority is higher than that of the second target sending queue in the sending queues.

Optionally, the apparatus further includes a memory, and the second target sending queue is located in any one of the memory, the processor, and the target hardware engine.

Optionally, the first decoding task includes storage addresses of FEC packets that are not lost in the first group of FEC packets, or the first decoding task includes storage addresses of FEC packets that are not lost in the first group of FEC packets and the priority of the first data stream, or the first decoding task includes the first group of FEC packets, or the first decoding task includes the first group of FEC packets and the priority of the first data stream.

In some possible implementations, a function of the packet processing apparatus shown in FIG. 5 may be alternatively implemented by using a chip, and the chip may include the processor 501 in FIG. 5 and the target hardware engine 502 in FIG. 5.

Figure 6:
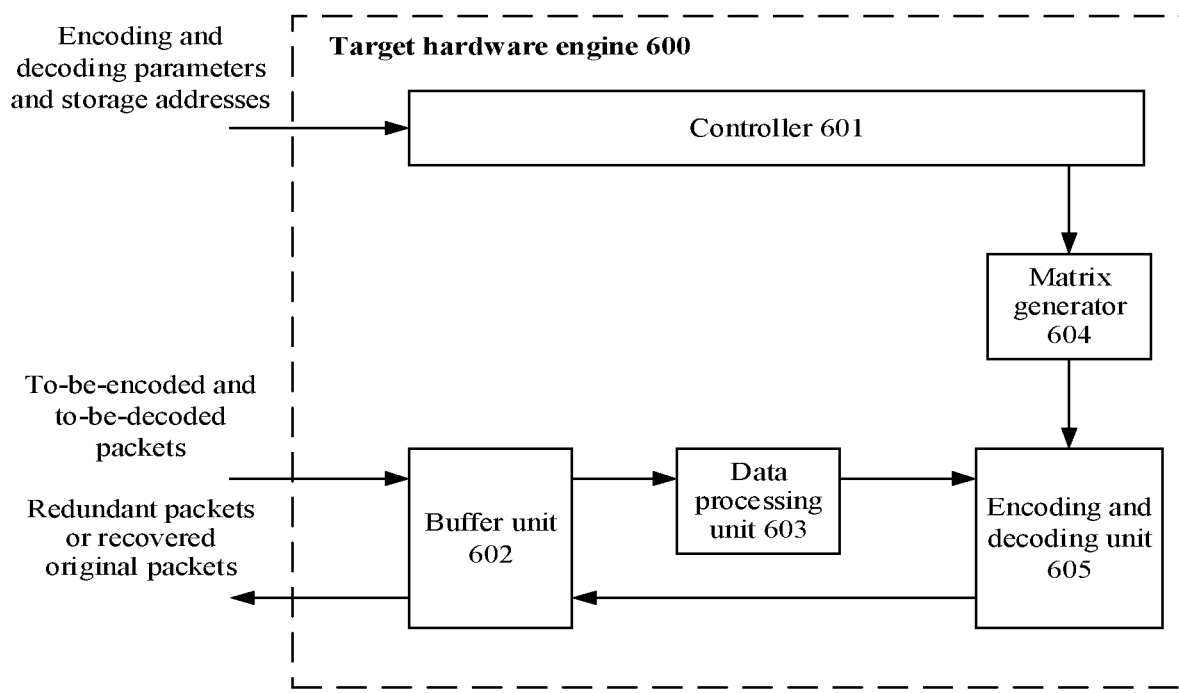
FIG. 6 is a schematic diagram of a target hardware engine according to an embodiment of this application.

For ease of description, the first network device 302 and the second network device 303 each are denoted as a computing device. The computing devices each may include the target hardware engine, and the target hardware engine is configured to perform encoding and decoding computation. An embodiment of this application provides a schematic diagram of the target hardware engine. Refer to a target hardware engine 600 in FIG. 6. The target hardware engine 600 includes a controller 601, a buffer unit 602, a data processing unit 603, a matrix generator 604, and an encoding and decoding unit 605. The controller 601 is configured to receive encoding and decoding parameters and storage addresses of to-be-encoded and to-be-decoded packets that are sent by a CPU of a computing device, and determine a corresponding data processing policy, model parameters of an encoding and decoding model, and model parameters of a matrix model based on the encoding and decoding parameters. The encoding and decoding parameters includes encoding parameters or decoding parameters, and the decoding parameters may be content in an FEC packet header. The to-be-encoded and to-be-decoded packets may be M original packets, or FEC packets that are not lost. The encoding and decoding model may include an encoding model or a decoding model. Model parameters of the encoding model are an original packet quantity M and a target size L. Model parameters of the decoding model include a lost original FEC packet quantity F and the target size L, where F is greater than 0 and less than or equal to R. The model parameters of the matrix model include model parameters of a generator matrix or model parameters of a target check matrix. The model parameters of the generator matrix include the original packet quantity M, a redundant packet quantity R, and the target size L. The model parameters of the target check matrix include the lost original FEC packet quantity F, the redundant packet quantity R, and the target size L.

The controller 601 is further configured to obtain the to-be-encoded and to-be-decoded packets from a memory of the computing device based on the storage addresses of the received to-be-encoded and to-be-decoded packets, and store the to-be-encoded and to-be-decoded packets in the buffer unit 602. The controller 601 is further configured to send the model parameters of the encoding and decoding model and the data processing policy to the data processing unit 603, so that the data processing unit 603 generates a to-be-encoded matrix or a recovery matrix based on the to-be-encoded and to-be-decoded packets and the model parameters of the encoding and decoding model and according to the data processing policy, and sends the to-be-encoded matrix or the recovery matrix to the encoding and decoding unit 605.

The controller 601 is further configured to send the model parameters of the matrix model to the matrix generator 604, so that the matrix generator 604 constructs the generator matrix or the target check matrix based on the model parameters of the matrix model, and sends the generator matrix or the target check matrix to the encoding and decoding unit 605.

Figure 2:
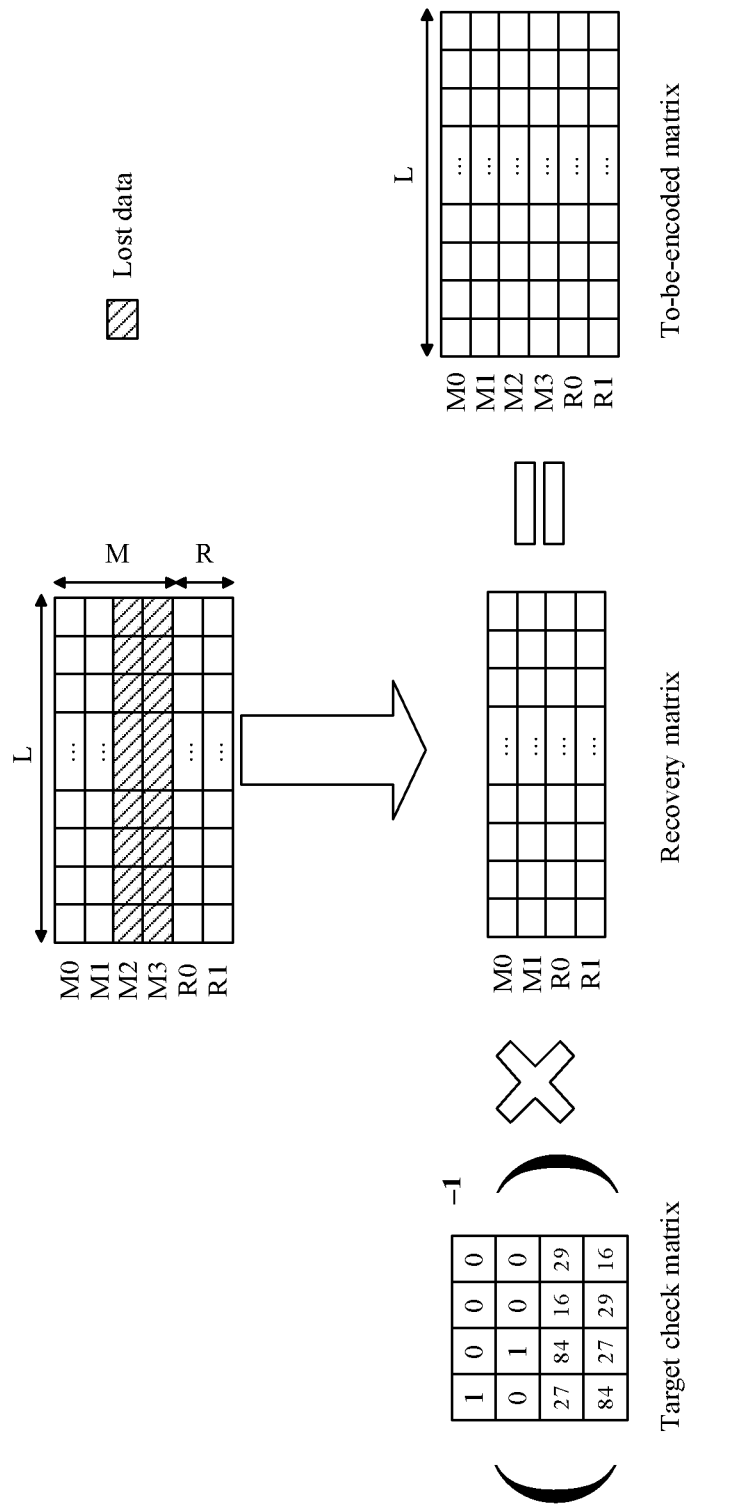
FIG. 2 is a schematic diagram of an FEC decoding process according to an embodiment of this application.

The encoding and decoding unit 605 is configured to perform encoding and decoding computation on the received to-be-encoded matrix or the received recovery matrix and the corresponding generator matrix or the corresponding target check matrix, to obtain redundant packets or lost original FEC packets (for details, refer to the encoding computation process and the decoding computation process shown in FIG. 1 and FIG. 2), and send the redundant packets or the lost original FEC packets to the buffer unit 602. The buffer unit 602 sends the redundant packets or recovered packets to the memory of the computing device or a processor.

The encoding and decoding unit 605 in the target hardware engine may multiplex FEC encoding logic and FEC decoding logic. When FEC encoding needs to be performed, the encoding and decoding unit 605 performs FEC encoding on the generator matrix and the to-be-encoded matrix based on the FEC encoding logic. When FEC decoding needs to be performed, the encoding and decoding unit 605 performs FEC decoding on the target check matrix and the recovery matrix based on the FEC decoding logic. In some possible implementations, the encoding and decoding unit 605 may include an encoding subunit and a decoding subunit. The encoding subunit may perform FEC encoding on the generator matrix and the to-be-encoded matrix based on the FEC encoding logic, and the decoding subunit may perform FEC decoding on the target check matrix and the recovery matrix based on the FEC decoding logic.

Figure 7:
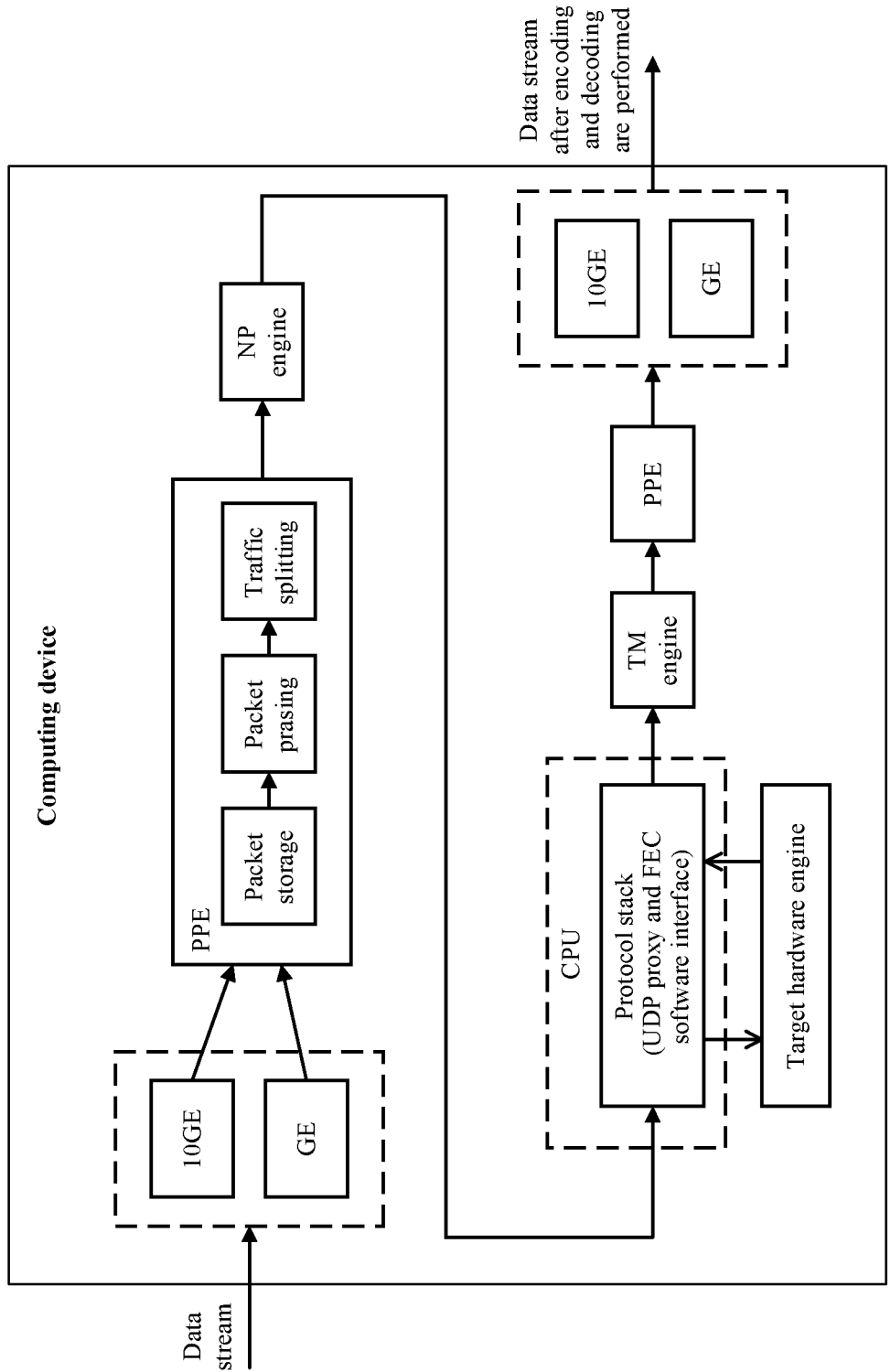
FIG. 7 is a flowchart of a packet processing method according to an embodiment of this application.

To further describe the encoding process and the decoding process of the computing device, refer to a flowchart of a packet processing method according to an embodiment of this application shown in FIG. 7. A computing device receives packets in a data stream through a gigabit Ethernet (GE) network port or a 10 GE (10GE) network port. The GE/10GE network port sends the received packets to a packet parse engine (PPE). The PPE stores the packets in a memory, preliminarily parses the packets to obtain descriptors of the packets, and sends a notification message that carries storage addresses of the packets to a network processor (NP) engine through traffic splitting. The NP engine may perform deep parsing on the packets in the memory, to determine whether the packets need to be encoded. When the packets need to be encoded, the NP engine may further forward the notification message to a CPU. A protocol stack of the CPU sends the notification message to a User Datagram Protocol (UDP) proxy. When a quantity of notification messages received by the UDP proxy reaches a specific quantity, it indicates that the memory has stored to-be-encoded packets required for current encoding in a current time period, and the CPU delivers an encoding task to a target hardware engine through an FEC software interface. The target hardware engine obtains the to-be-encoded packets from the memory based on storage addresses of the to-be-encoded packets carried in the encoding task, generates redundant packets, and stores the redundant packets in the memory. After storage is completed, the target hardware engine reports encoding task completion information to the FEC software interface in the CPU. The FEC software interface obtains the to-be-encoded packets and the redundant packets from the memory based on the storage addresses of the to-be-encoded packets and storage addresses of the redundant packets that are carried in the encoding task completion information, and adds FEC packet headers to the obtained to-be-encoded packets and the redundant packets, to generate FEC packets. The FEC software interface sends the FEC packets to a traffic management (TM) engine, to form an encoding stream after encoding is performed (i.e., a data stream). The TM engine manages the encoding stream based on a requirement of the CPU or a requirement of another hardware engine, for example, quality of service (QoS) scheduling, traffic shaping, and traffic statistics collection. The TM engine sends the managed encoding stream to the PPE. The PPE forwards the managed encoding stream to the GE/10GE network port, and the GE/10GE network port outputs the managed encoding stream. It should be noted that, in some possible implementations, the computing device does not include the NP engine, the PPE, and the TM engine, and work of the NP engine, the PPE, and the TM engine may all be completed by one processor or the CPU. Alternatively, the work of the NP engine, the PPE, the TM engine, and the CPU may be completed by one processor.

The foregoing describes the encoding process of the computing device. The decoding process of the computing device is described as follows. When packets stored in the memory of the computing device are FEC packets, if original packets in a group of FEC packets whose packet headers are the same are lost, the CPU delivers a decoding task to the target hardware engine through the FEC software interface. The target hardware engine obtains the group of FEC packets from the memory based on storage addresses of the group of FEC packets carried in the decoding task, recovers the lost original packets based on the group of FEC packets, and stores the recovered original packets in the memory. After storage is completed, the target hardware engine reports decoding task completion information to the FEC software interface in the CPU. The FEC software interface obtains original packets that are not lost in the group of original FEC packets and the recovered original packets from the memory based on storage addresses of the original packets that are not lost and storage addresses of the recovered original packets that are carried in the decoding task completion information, and forms a data stream for output by using the obtained original packets. A manner of outputting the data stream by the CPU is similar to a manner of outputting the encoding stream. Herein, the manner of outputting the data stream by the CPU is not described again in this embodiment of this application.

In some possible implementations, the protocol stack, the UDP proxy, and the FEC software interface may not be deployed in the CPU, but are deployed in the NP engine. In this case, in the encoding process and the decoding process, interaction between the NP engine, the target hardware engine, and the memory needs to be performed. The CPU does not need to interact with the target hardware engine and the memory. In some possible implementations, after obtaining an encoding matrix or a to-be-encoded matrix through encoding and decoding, the target hardware engine may directly encapsulate original packets and redundant packets in the encoding matrix into FEC packets, and output the FEC packets to a network device, or directly obtain original packets from the to-be-encoded matrix and output the original packets to a network device. In some possible implementations, the target hardware engine may further directly send the encoding matrix or the to-be-encoded matrix to the FEC software interface, and the FEC software interface encapsulates the original packets and the redundant packets in the encoding matrix into the FEC packets, and outputs the FEC packets to the network device. Alternatively, the FEC software interface obtains the original packets from the to-be-encoded matrix, and outputs the original packets to the network device.

Figure 8A:
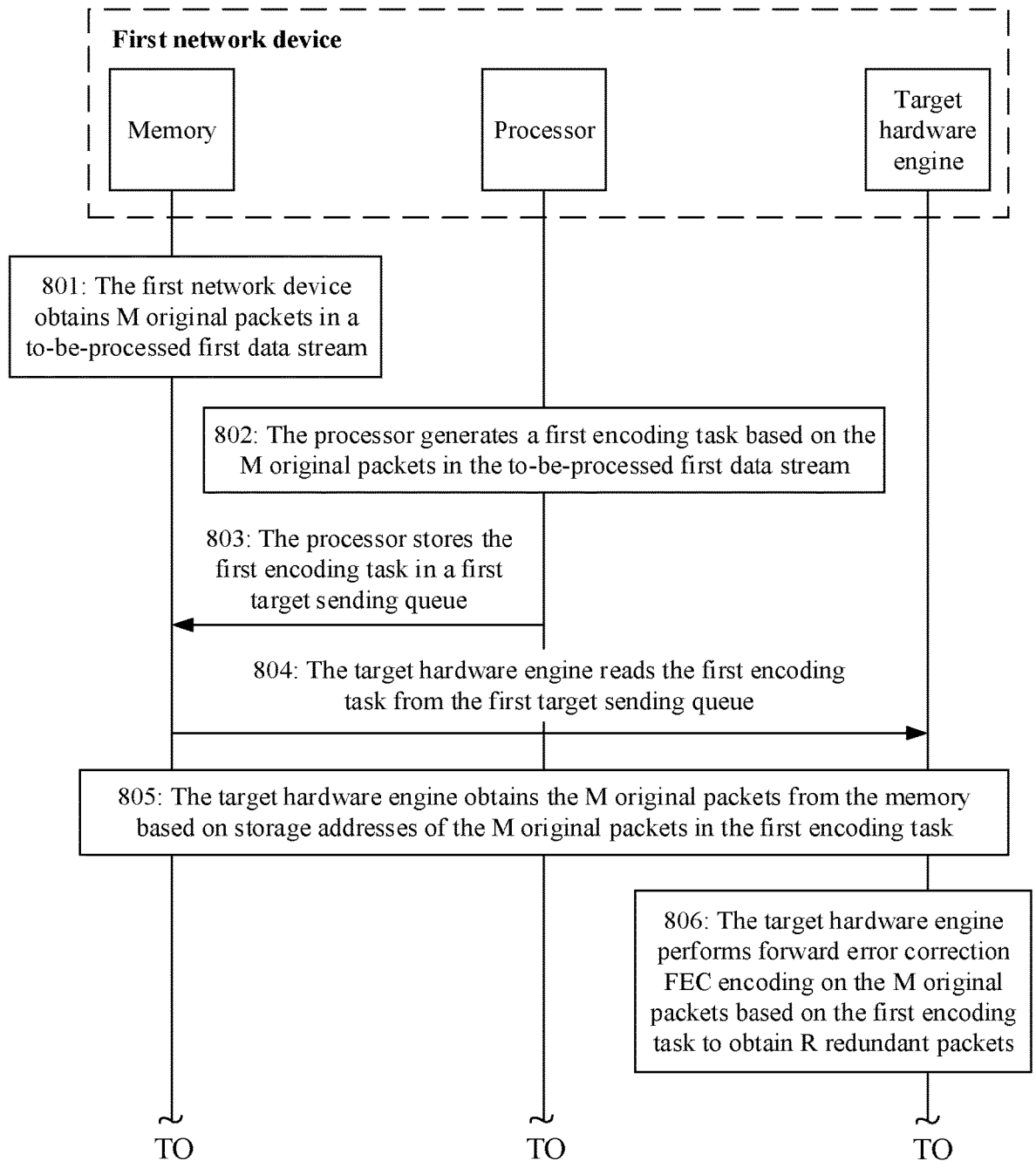
FIG. 8A and FIG. 8B are a flowchart of a packet processing method according to an embodiment of this application.
Figure 8B:
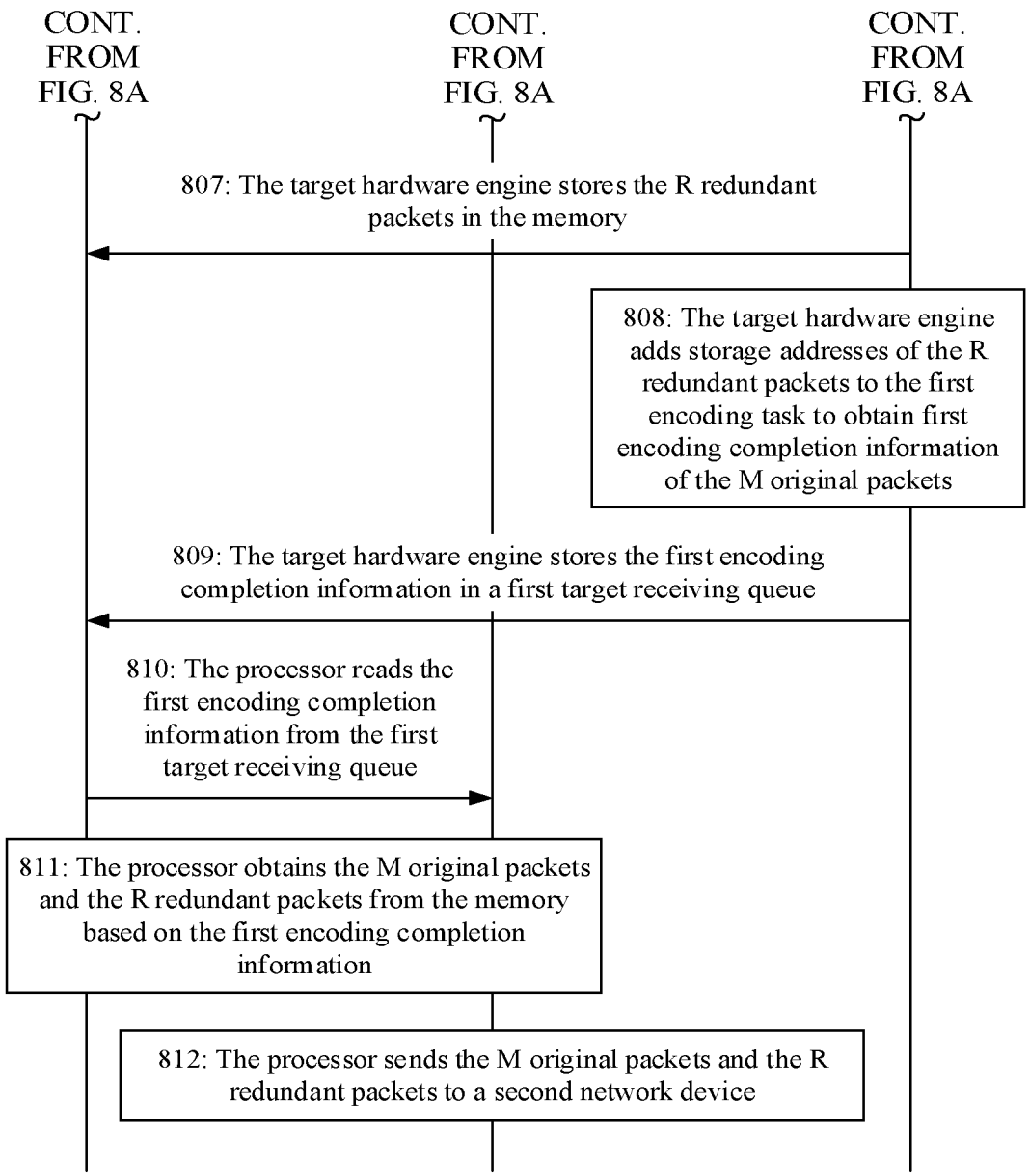

In conclusion, the encoding process of the network device is summarized as follows. After obtaining any data stream, the network device may store the any data stream in the memory. If packets in the any data stream are to-be-encoded packets, the processor in the network device may generate an encoding task used to indicate to encode the plurality of to-be-encoded packets, and the processor may deliver the encoding task to the memory. The target hardware engine in the network device reads the encoding task in the memory, performs FEC encoding on the plurality of to-be-encoded packets stored in the memory based on the encoding task to obtain redundant packets of the plurality of to-be-encoded packets, and then stores the redundant packets in the memory. Then, the processor may obtain the plurality of to-be-encoded packets and the redundant packets of the plurality of to-be-encoded packets from the memory, and encapsulate the obtained packets into FEC packets. To further describe the processing process, refer to a flowchart of a packet processing method according to an embodiment of this application shown in FIG. 8A and FIG. 8B. A first network device may include a processor and a target hardware engine, and a procedure of the method may include the following steps 801 to 812.

Step 801: The first network device obtains M original packets in a to-be-processed first data stream.

The first network device may obtain a plurality of data streams. The first data stream is any data stream in the plurality of data streams, and the first data stream may include a plurality of packets. The data stream may be a video data stream, an audio data stream, a text data stream, or the like. A type of the first data stream is not limited in this embodiment of this application.

The M original packets are any M consecutive original packets in the first data stream. The first network device may encode the M original packets each time, and encode other M original packets in the first data stream after one time of encoding is completed. In some possible implementations, step 801 may be implemented by using a process shown in steps 8011 and 8012.

Step 8011: The first network device stores received original packets in the first data stream in a memory of the first network device.

Each time after receiving one original packet in the first data stream, a GE/10GE network port of the first network device sends the original packet to a PPE. Each time after receiving the original packet, the PPE stores the original packet in the memory, and records a storage address of the original packet.

Step 8012: If a quantity of unencoded original packets in the first data stream in the memory is greater than or equal to M, the processor obtains the M original packets from the unencoded original packets in the first data stream.

The processor may include at least one of a CPU and an NP engine in the first network device. After each time of encoding, the first network device encodes a next group of M unencoded original packets. Therefore, for the original packets in the first data stream, when each time M original packets are newly buffered in the memory of the first network device, the newly buffered M original packets may be used as to-be-encoded M original packets next time in the first data stream.

In some possible implementations, the first network device may further set preset duration. For the original packets in the first data stream, each time one preset duration elapses, the first network device uses original packets newly stored within the preset duration as to-be-encoded original packets next time. In some possible implementations, a value of M may vary each time of encoding. For example, the first network device obtains five original packets after one preset duration elapses, and in this case, M is equal to 5, and then after next preset duration elapses, the first network device newly obtains four original packets, and in this case, M is equal to 4. The preset duration is not limited in this embodiment of this application.

After the PPE stores the one original packet in the memory, the PPE sends a storage completion message corresponding to the original packet to the NP engine, where the storage completion message may carry a stream identifier of the first data stream and a storage address of the original packet, and the stream identifier may be a name or a number of the first data stream and is used to indicate a data stream to which the original packet belongs. In some possible implementations, the first network device sets a corresponding priority for each received data stream based on a service requirement, and the first network device may preferably process a data stream whose priority is higher. Correspondingly, the storage completion message may further carry a priority corresponding to the first data stream. In this way, each module in the first network device may process original packets in the corresponding data streams based on the priorities. A user may configure a priority information table on the first network device, where the priority information table includes a plurality of priorities in descending order, and each of the priorities corresponds to one service type. When receiving the first data stream, the first network device may determine a service type of the first data stream based on data carried in the original packets in the first data stream, and determine a priority corresponding to the service type of the first data stream from the priority information table, so that the first network device may set the corresponding priority for the first data stream.

After receiving the storage completion message, the NP engine may send the storage completion message to a protocol stack. Therefore, a UDP proxy may collect each storage completion message from the protocol stack. When a quantity of storage completion messages newly collected by the UDP proxy is M, the newly collected M storage completion messages may indicate that M to-be-encoded packets are newly stored in the memory. Therefore, the UDP proxy may use the M original packets corresponding to the M storage completion messages as M to-be-encoded original packets.

Step 802: The processor generates a first encoding task based on the M original packets in the to-be-processed first data stream, where M is a positive integer, and the first encoding task is used to indicate to encode the M original packets.

Step 802 may be performed by an FEC software interface in the processor of the first network device. Each time the UDP proxy collects the M storage completion messages, the UDP proxy may send the collected M storage completion messages to the FEC software interface in the processor. After receiving the M storage completion messages, the FEC software interface may perform step 802.

The FEC software interface may obtain storage addresses of the M original packets from the M storage completion messages, where the storage addresses of the M original packets include a storage address of each of the M original packets. The FEC software interface may generate the first encoding task based on the storage addresses of the M original packets and encoding parameters, where the first encoding task may include the storage addresses of the M original packets and the encoding parameters, so that the target hardware engine may obtain the M original packets from the memory based on the storage addresses and encode the obtained M original packets based on the encoding parameters. In some possible implementations, the first encoding task may not include the storage addresses of the M original packets, but include the M original packets, so that the target hardware engine may directly obtain the M original packets from the first encoding task. When the first data stream has the priority, the first encoding task may further include the priority of the first data stream. The encoding task may further carry an encoding identifier used to indicate to encode each packet. A manner of representing the encoding identifier is not limited in this embodiment of this application.

The encoding parameters may be encoding parameters preset by the first network device. The first network device may use the encoding parameters each time the first network device performs encoding. Certainly, the first network device may also properly adjust the encoding parameters based on a packet transmission status. When the first network device performs encoding based on a same encoding parameter each time, the same encoding parameter may be an original packet quantity M in the encoding parameters. The first network device may further dynamically modify the original packet quantity M in the encoding parameters based on current CPU overheads or a current computing capability of the target hardware engine. For example, when the CPU overheads are relatively small or the target hardware engine currently has a sufficient computing capability, the first network device may properly increase the original packet quantity, in other words, the first network device may properly increase packets on which encoding is performed once. Conversely, the first network device may properly reduce the original packet quantity, in other words, the first network device may properly reduce the packets on which encoding is performed once.

The first network device may further dynamically adjust a redundant packet quantity R in model parameters based on a current network packet loss rate. For example, when the network packet loss rate is relatively high, the first network device may properly increase the redundant packet quantity R, in other words, the first network device may properly increase a quantity of redundant packets generated in one encoding process, to recover all lost packets subsequently. When the network packet loss rate is relatively low, the first network device may properly reduce the redundant packet quantity R, in other words, the first network device may properly reduce the quantity of redundant packets generated in one encoding process, to improve encoding efficiency.

Because the first network device may dynamically adjust the encoding parameters, encoding efficiency of the first network device may be improved by adjusting the encoding parameters.

Step 803: The processor stores the first encoding task in a first target sending queue, where the first target sending queue is used to store encoding tasks of to-be-processed data streams of the first network device, and the to-be-processed data streams of the first network device include the first data stream.

Step 803 may be performed by the FEC software interface in the processor. The first network device may preset a plurality of sending queues. Each of the sending queues is used to store encoding tasks of to-be-processed data streams of the first network device. The first target sending queue may be any one of the plurality of sending queues. The plurality of sending queues may be located in any one of the memory, the processor, and the target hardware engine of the first network device.

Figure 9:
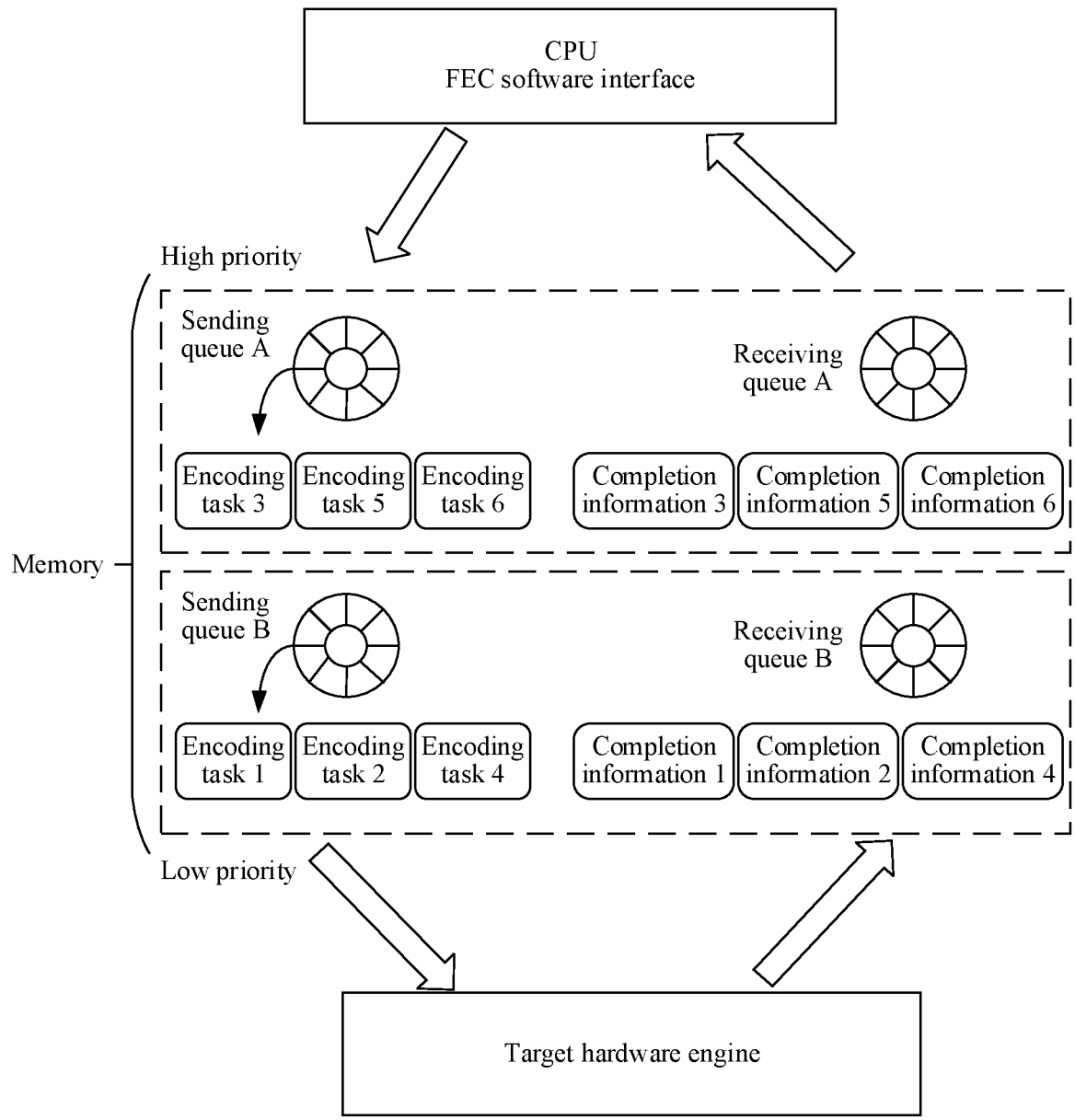
FIG. 9 is a schematic diagram of an internal interaction procedure in a network device according to an embodiment of this application.

In some possible implementations, the first network device may set a priority for each of the sending queues, and each of the sending queues is used to store encoding tasks of data streams whose priorities are the same. For example, FIG. 9 is a schematic diagram of an internal interaction procedure of a network device according to an embodiment of this application. In FIG. 9, there are a sending queue A whose priority is A and a sending queue B whose priority is B in a memory, where the priority A is higher than the priority B. In this case, the sending queue A stores encoding tasks 3, 5, and 6, and the sending queue B stores encoding tasks 1, 2, and 4. The encoding tasks 3, 5, and 6 are encoding tasks whose priorities are A, and the encoding tasks 1, 2, and 4 are encoding tasks whose priorities are B.

In some possible implementations, step 803 may include the following. The processor adds the first encoding task to the first target sending queue based on the priority of the first data stream, where a priority of the first target sending queue is equal to the priority of the first data stream. Further, after the FEC software interface generates one first encoding task, the FEC software interface may determine the first target sending queue corresponding to the priority of the first data stream in the memory based on the priority of the first data stream. When a quantity of encoding tasks in the first target sending queue is less than a first target quantity, the FEC software interface adds the first encoding task to the first target sending queue, where the first target quantity is a maximum quantity of encoding tasks that can be stored in the first target sending queue. When the quantity of encoding tasks in the first target sending queue is equal to the first target quantity, the FEC software interface queries whether the quantity of encoding tasks in the first target sending queue is less than the first target quantity every first preset duration. Once the quantity is less than the first target quantity, the FEC software interface adds the first encoding task to the first target sending queue. The first preset duration is not limited in this embodiment of this application. The target hardware engine may query the first target sending queue whenever an encoding and decoding unit is idle.

Step 804: The target hardware engine reads the first encoding task from the first target sending queue.

The target hardware engine may first poll each of the sending queues in the memory based on a priority sequence, to determine whether the target hardware engine needs to read the first encoding task from the first target sending queue. In some possible implementations, the target hardware engine sequentially queries, based on the priority sequence of the sending queues, whether there are encoding tasks in each of the sending queues, where each of the sending queues corresponds to one priority. In each of the sending queues, the target hardware engine reads the first encoding task from the first target sending queue when there is no encoding task in a queue whose priority is higher than that of the first target sending queue.

A process in which the target hardware engine polls each of the sending queues may be as follows. The target hardware engine queries a first sending queue whose priority is the highest in the sending queues. When there are encoding tasks in the first sending queue, the target hardware engine obtains one encoding task from a queue head of the first sending queue, and performs the following step 805 based on the encoding task. The target hardware engine queries the first sending queue again every second preset duration. When there are still encoding tasks in the first sending queue, the target hardware engine obtains a new encoding task from the queue head of the first sending queue again. Until the first sending queue stores no encoding task, the target hardware engine queries whether a second sending queue corresponding to a second priority in the plurality of sending queues has encoding tasks. When the second sending queue has the encoding tasks, the target hardware engine obtains one encoding task from the second sending queue, and performs the following step 805. The second priority is a priority second to the highest priority. When the second sending queue has no encoding task, the target hardware engine queries a sending queue whose priority is second to the second priority based on the priority sequence by analogy.

After an encoding task at a queue head of a sending queue is obtained by the target hardware engine, a next encoding task in the sending queue becomes the queue head of the sending queue. In this way, the target hardware engine may obtain the next encoding task from the queue head of the sending queue next time.

Step 805: The target hardware engine obtains the M original packets from the memory based on the storage addresses of the M original packets in the first encoding task.

After obtaining the first encoding task, a controller in the target hardware engine may obtain the storage addresses of the M original packets from the first encoding task, and the target hardware engine may send a first packet obtaining request to the memory. The first packet obtaining request carries the storage addresses of the M original packets. After receiving the first packet obtaining request, the memory sends the M original packets stored in the storage addresses to the target hardware engine. After receiving the M original packets, the target hardware engine buffers the M original packets in a buffer unit, so that a data processing unit processes the M original packets. Certainly, if the first encoding task directly carries the M original packets, the target hardware engine may directly obtain the M original packets from the first encoding task without obtaining the M original packets from the memory.

Step 806: The target hardware engine performs FEC encoding on the M original packets based on the first encoding task to obtain R redundant packets, where R is a positive integer.

After obtaining the M original packets, the target hardware engine may perform FEC encoding on the M original packets based on the encoding parameters in the first encoding task. In a possible manner, the data processing unit in the target hardware engine may perform padding processing on the M original packets based on the original packet quantity M in the encoding parameters, to obtain M equal-length packets. The data processing unit forms a to-be-encoded matrix by using the M equal-length packets, where one row of the to-be-encoded matrix is one equal-length packet, and sends the to-be-encoded matrix to the encoding and decoding unit. The encoding and decoding unit performs multiplication calculation on a corresponding generator matrix and the to-be-encoded matrix, to obtain the R redundant packets and to implement step 806. FIG. 1 describes a process of performing multiplication calculation on the generator matrix and the to-be-encoded matrix. Herein, the process is not described again in this embodiment of this application.

The generator matrix may be generated by a matrix generator in the target hardware engine, and sent to the encoding and decoding unit. A process in which the matrix generator generates the corresponding generator matrix is as follows. The controller in the target hardware engine may obtain the redundant packet quantity R and the original packet quantity M from the first encoding task, and send the obtained redundant packet quantity R and the obtained original packet quantity M to the matrix generator. The matrix generator generates a (M+R)×M generator matrix based on the redundant packet quantity R and the original packet quantity M, and sends the (M+R)×M generator matrix to the encoding and decoding unit.

Step 807: The target hardware engine stores the R redundant packets in the memory.

After generating the R redundant packets, the encoding and decoding unit in the target hardware engine buffers the R redundant packets in the buffer unit, and the buffer unit sends a first packet storage request to the memory. The first packet storage request carries storage addresses of the R redundant packets and the R redundant packets, and the storage addresses of the R redundant packets include a storage address of each of the redundant packets. After receiving the first packet storage request, the memory stores the R redundant packets in the storage addresses of the R redundant packets.

Step 808: After the R redundant packets are stored, the target hardware engine adds the storage addresses of the R redundant packets to the first encoding task to obtain first encoding completion information of the M original packets, where the first encoding completion information is used to indicate that encoding of the M original packets is completed.

The target hardware engine may further replace the encoding identifier in the first encoding task with an encoding completion identifier, where the encoding completion identifier is used to represent that encoding of the original packet is completed. A manner of representing the encoding completion identifier is not limited in this embodiment of this application. Because the first encoding task includes the storage addresses of the M first packets and the encoding parameters, the first encoding completion information may include the storage addresses of the R redundant packets, the storage addresses of the M original packets, and the encoding parameters. When the first encoding task carries the priority of the first data stream, the first encoding completion information may further include the priority of the first data stream.

Step 809: The target hardware engine stores the first encoding completion information in a first target receiving queue, where the first target receiving queue is used to store encoding completion information of the to-be-processed data streams of the first network device.

The first network device may preset a plurality of receiving queues. Each of the receiving queue is used to store encoding completion information of to-be-processed data streams of the first network device. The first target receiving queue may be any one of the plurality of receiving queues. The plurality of receiving queues may be located in any one of the memory, the processor, and the target hardware engine of the first network device.

In some possible implementations, the first network device may set a priority for each of the receiving queues, and each of the receiving queues is used to store encoding completion information of data streams whose priorities are the same. FIG. 9 is still used as an example. In FIG. 9, there are a receiving queue A whose priority is A and a receiving queue B whose priority is B, where the priority A is higher than the priority B. In this case, the receiving queue A stores encoding completion information 3, 5, and 6 (which are briefly referred to as "completion information 3, 5, and 6" in FIG. 9), and the receiving queue B stores encoding completion information 1, 2, and 4, where the encoding completion information 3, 5, and 6 are encoding completion information whose priority is A, and the encoding completion information 1, 2, and 4 (which are briefly referred to as "completion information 1, 2, and 4" in FIG. 9) are encoding completion information whose priority is B.

In some possible implementations, the target hardware engine adds the first encoding completion information to the first target receiving queue in the memory based on the priority of the first data stream, where a priority of the first target receiving queue is equal to the priority of the first data stream. Further, the target hardware engine may determine, based on the priority of the first data stream, the first target receiving queue corresponding to the priority of the first data stream in the memory. When an amount of encoding completion information in the first target receiving queue is less than a second target quantity, the target hardware engine adds the first encoding completion information to the first target receiving queue, where the second target quantity is a maximum amount of encoding completion information that can be stored in the first target receiving queue. When the amount of encoding completion information in the first target receiving queue is equal to the second target quantity, the FEC software interface queries whether the amount of encoding completion information in the first target receiving queue is less than the second target quantity every second preset duration. Once the amount is less than the second target quantity, the FEC software interface adds the first encoding completion information to the first target receiving queue. The second preset duration is not limited in this embodiment of this application.

Step 810: The processor reads the first encoding completion information from the first target receiving queue.

Step 810 may be performed by the FEC software interface in the processor. The FEC software interface may poll each of the receiving queues based on a priority sequence. The FEC software interface may first determine, in a polling manner, whether the encoding completion information can be obtained from the first target receiving queue. In some possible implementations, the FEC software interface sequentially queries, based on the priority sequence, whether each of the receiving queues has other encoding completion information. Each of the receiving queues corresponds to one priority. In each of the receiving queues, the FEC software interface obtains the first encoding completion information from the first target receiving queue when there is no other encoding completion information in a queue whose priority is higher than that of the first target receiving queue.

A process in which the FEC software interface polls each of the receiving queues may be as follows. The FEC software interface queries a first receiving queue whose priority is the highest in the receiving queues. When the first receiving queue has encoding completion information, the FEC software interface obtains one piece of encoding completion information from a queue head of the first receiving queue, and performs the following step 811 based on the encoding completion information. The FEC software interface queries the first receiving queue again every third preset duration. When the first receiving queue still stores encoding completion information, the FEC software interface obtains one new piece of encoding completion information from the queue head of the first receiving queue again. Until the first receiving queue stores no encoding task, the FEC software interface queries whether a second receiving queue corresponding to a next priority in the plurality of receiving queues has encoding completion information. When the second receiving queue stores the encoding completion information, the FEC software interface obtains one piece of encoding completion information from the second receiving queue and performs the following step 811. When the second receiving queue stores no encoding completion information, the FEC software interface queries a third receiving queue whose priority is second to the second priority based on the priority sequence by analogy.

After encoding completion information in a first receiving queue is obtained by the FEC software interface, next piece of encoding completion information in the first receiving queue becomes the queue head of the first receiving queue. In this way, the FEC software interface obtains the next piece of encoding completion information from the queue head of the first receiving queue next time.

Step 811: The processor obtains the M original packets and the R redundant packets from the memory based on the first encoding completion information.

Step 811 may be performed by the FEC software interface in the processor. The FEC software interface may obtain the storage addresses of the R redundant packets, the storage addresses of the M original packets, and the encoding parameters from the first encoding completion information. The FEC software interface sends a second packet obtaining request to the memory, where the second packet obtaining request carries the storage addresses of the R redundant packets and the storage addresses of the M original packets. When receiving the second packet obtaining request, the memory returns the R redundant packets and the M original packets to the FEC software interface based on the storage addresses of the R redundant packets and the storage addresses of the M original packets in the second packet obtaining request.

Step 812: The processor sends the M original packets and the R redundant packets to a second network device.

Step 812 may be performed by the FEC software interface in the processor. After obtaining the R redundant packets and the M original packets returned by the memory, the FEC software interface encapsulates the R redundant packets and the M original packets into FEC packets based on the encoding parameters in the first encoding completion information. In some possible implementations, step 812 may be implemented by using a process shown in the following steps 8121 to 8123.

Step 8121: The FEC software interface performs padding processing on packets whose sizes are less than a target size in the M original packets based on the target size in the encoding parameters, to obtain the M equal-length packets, where a size of each of the equal-length packets is the target size.

Step 8122: The FEC software interface adds an FEC packet header to each of the equal-length packets to obtain M original FEC packets, and adds an FEC packet header to each of the redundant packets to obtain R redundant FEC packets, where FEC packet header carries the encoding parameters of the M original packets.

Figure 10:
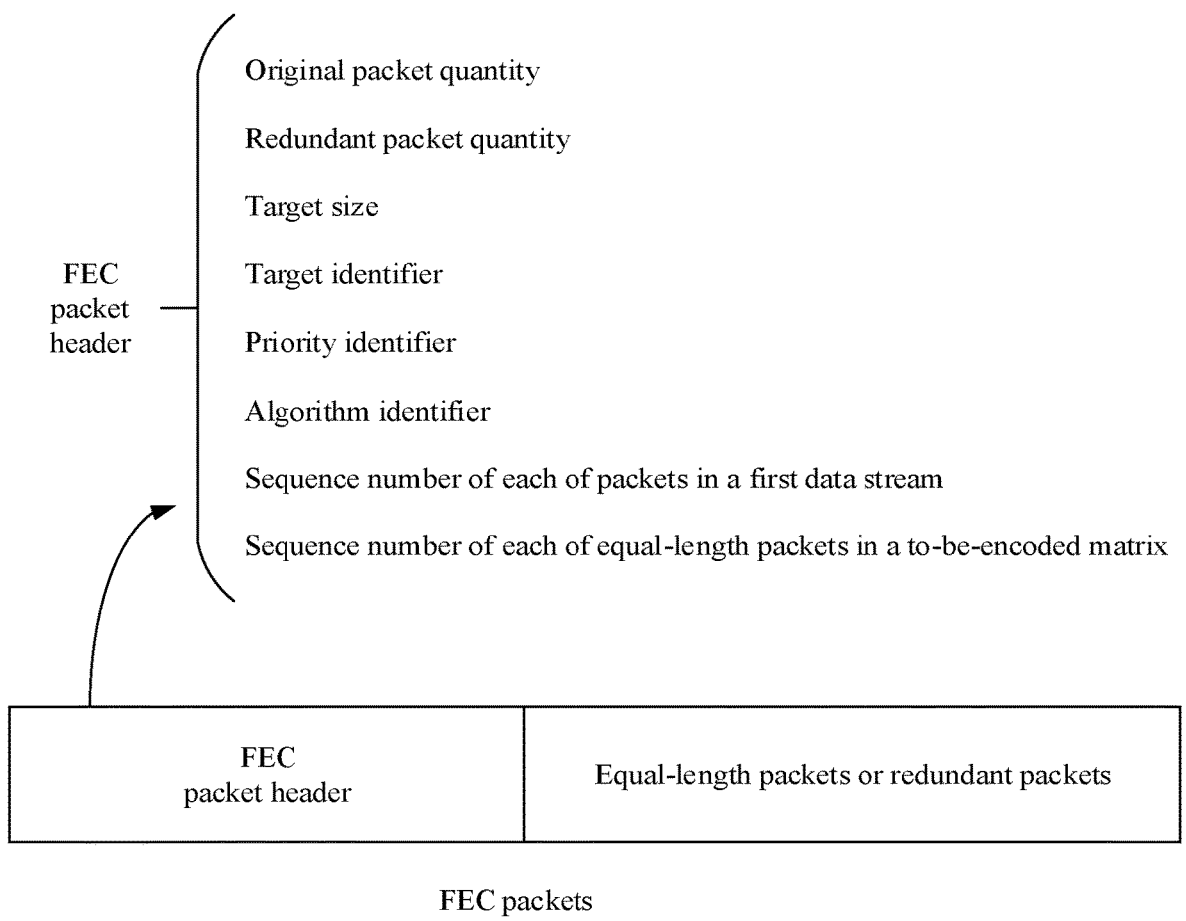
FIG. 10 is a schematic diagram of an FEC packet according to an embodiment of this application.

For example, FIG. 10 is a schematic diagram of an FEC packet according to an embodiment of this application. When a payload packet of the FEC packet in FIG. 10 is an equal-length packet formed by an original packet in the first data stream, the FEC packet is an original FEC packet. When the payload packet of the FEC packet is a redundant packet, the FEC packet is a redundant FEC packet.

An FEC packet header is used to indicate encoding statuses of the M original packets. The FEC packet header carries the encoding parameters of the M original packets. For example, the FEC packet header in FIG. 10 carries the original packet quantity M, where M=4, the redundant packet quantity R, where R=2, and the target size L, where L=30 megabytes (MB). The FEC packet header may further carry target identifiers of the M original packets, where the target identifier is used to indicate a quantity of times of encoding performed on the original packets in the first data stream. For example, when the target identifier in the FEC packet header in FIG. 10 is 1.2, it indicates that the first network device performs a second time of encoding on the packets in the first data stream 1, and the M original packets are original packets in the first data stream that are used for the second time of encoding.

The FEC packet header may further carry a priority identifier, an algorithm identifier, a sequence number of each of the M original packets in the first data stream, a sequence number of each of the equal-length packets in the to-be-encoded matrix, and a sequence number of each of the redundant packets in the encoding matrix. The priority identifier is used to indicate the priority of the first data stream, the algorithm identifier is used to indicate an algorithm used by the first network device in the encoding process, the sequence number of each of the equal-length packets in the to-be-encoded matrix is a row number of each of the equal-length packets in the to-be-encoded matrix, and the sequence number of each of the redundant packets in the encoding matrix is a row number of each of the redundant packets in the encoding matrix. For example, in the FEC packet header in FIG. 10, sequence numbers of original packets A0 to A3 in the first data stream are 10, 11, 12, and 13 respectively, sequence numbers of equal-length packets M0 to M3 are 0, 1, 2, and 3 respectively, and sequence numbers of redundant packets R0 and R1 are 4 and 5 respectively. An example of the FEC packet header in FIG. 10 is based on the encoding computation process shown in FIG. 1.

Step 8123: The processor sends the M original FEC packets and the R redundant FEC packets.

Because packet headers of the M original FEC packets and the R redundant FEC packets are the same, the M original FEC packets and the R redundant FEC packets may be considered as a group of FEC packets. For any FEC packet in the M original FEC packets and the R redundant FEC packets, each time after obtaining the any FEC packet, the FEC software interface outputs the any FEC packet to a TM engine in the first network device. Because the FEC software interface may continuously output the FEC packets to the TM engine, the TM engine may form an encoding stream corresponding to the first data stream. After managing the encoding stream, the TM engine outputs the managed encoding stream to the PPE. The PPE forwards the managed encoding stream to the GE/10GE network port, and the GE/10GE network port outputs the managed encoding stream to the second network device, so that the second network device can obtain the encoding stream.

Figure 11:
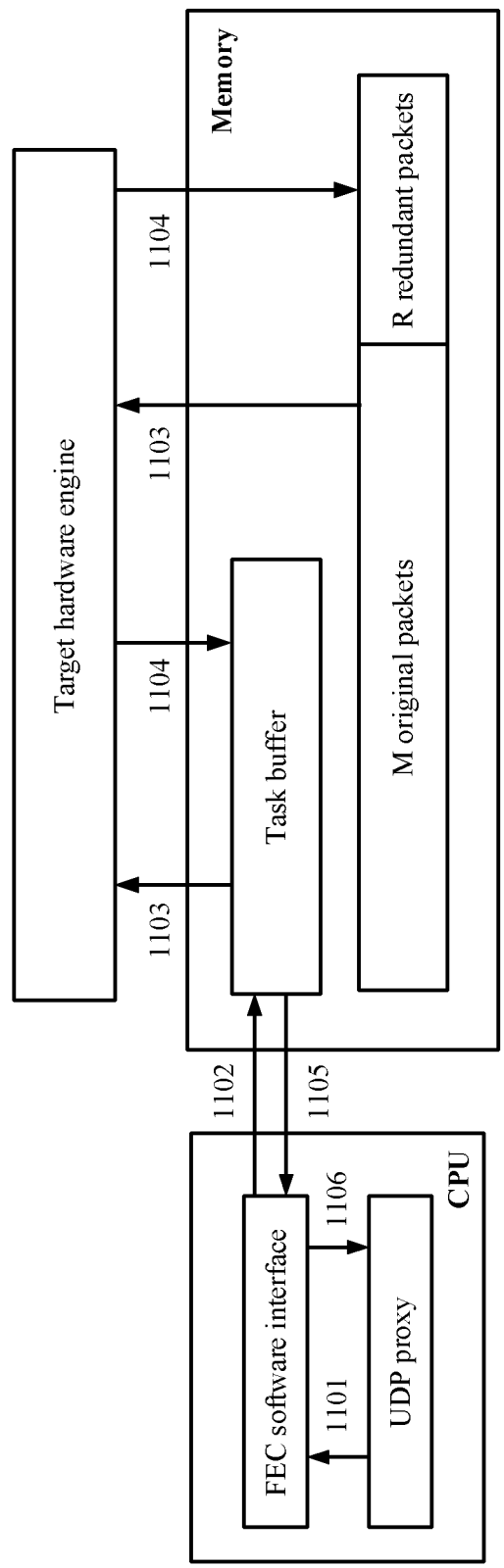
FIG. 11 is a flowchart of FEC encoding according to an embodiment of this application.

To further describe an interaction status between the processor, the target hardware engine, and the memory in the first network device in the encoding process, refer to a flowchart of FEC encoding according to an embodiment of this application shown in FIG. 11. A procedure includes steps 1101 to 1106.

Step 1101: The UDP proxy sends the storage completion message to the FEC software interface.

Step 1102: When a quantity of storage completion messages received by the FEC software interface is equal to M, the FEC software interface generates the first encoding task and sends the first encoding task to a task buffer of the memory.

The task buffer includes a plurality of sending queues and a plurality of receiving queues, and the FEC software interface may send the first encoding task to the first target sending queue corresponding to the priority of the first encoding task.

Step 1103: The target hardware engine obtains the first encoding task from the first target sending queue in the task buffer, and reads the M original packets from the memory based on the storage addresses in the first encoding task.

Step 1104: The target hardware engine performs FEC encoding on the read M original packets to obtain the R redundant packets, and the target hardware engine stores the R redundant packets in the memory, and sends the first encoding completion information to the first target receiving queue in the task buffer.

Step 1105: The FEC software interface reads the first encoding completion information from the first target receiving queue in the task buffer, reads the M original packets and the R redundant packets in the memory based on the first encoding completion information, and separately encapsulates the FEC packet header to each of the M original packets and each of the R redundant packets, to obtain the FEC packets.

Step 1106: The FEC software interface sends the FEC packets.

A process shown in steps 807 to 812 is a process in which the target hardware engine, the memory, and the processor collaboratively send the M original packets and the R redundant packets to the second network device. In some possible implementations, the target hardware engine may further directly send the M original packets and the R redundant packets to the processor, and the processor performs a process shown in 8122 and 8123, to transmit the M original packets and the R redundant packets. In some possible implementations, the target hardware engine may alternatively perform the process shown in 8122 and 8123, to transmit the M original packets and the R redundant packets.

According to the method provided in this embodiment of this application, FEC encoding is directly performed on the M original packets in the first data stream in the target hardware engine of the first network device rather than in the processor. Therefore, CPU overheads can be reduced, and encoding efficiency of the first network device can be improved. In this way, the first network device can easily meet a requirement of a large throughput in a packet transmission process. In addition, the first network device may dynamically adjust the encoding parameters, so that encoding efficiency of the first network device may be improved by adjusting the encoding parameters.

Figure 12A:
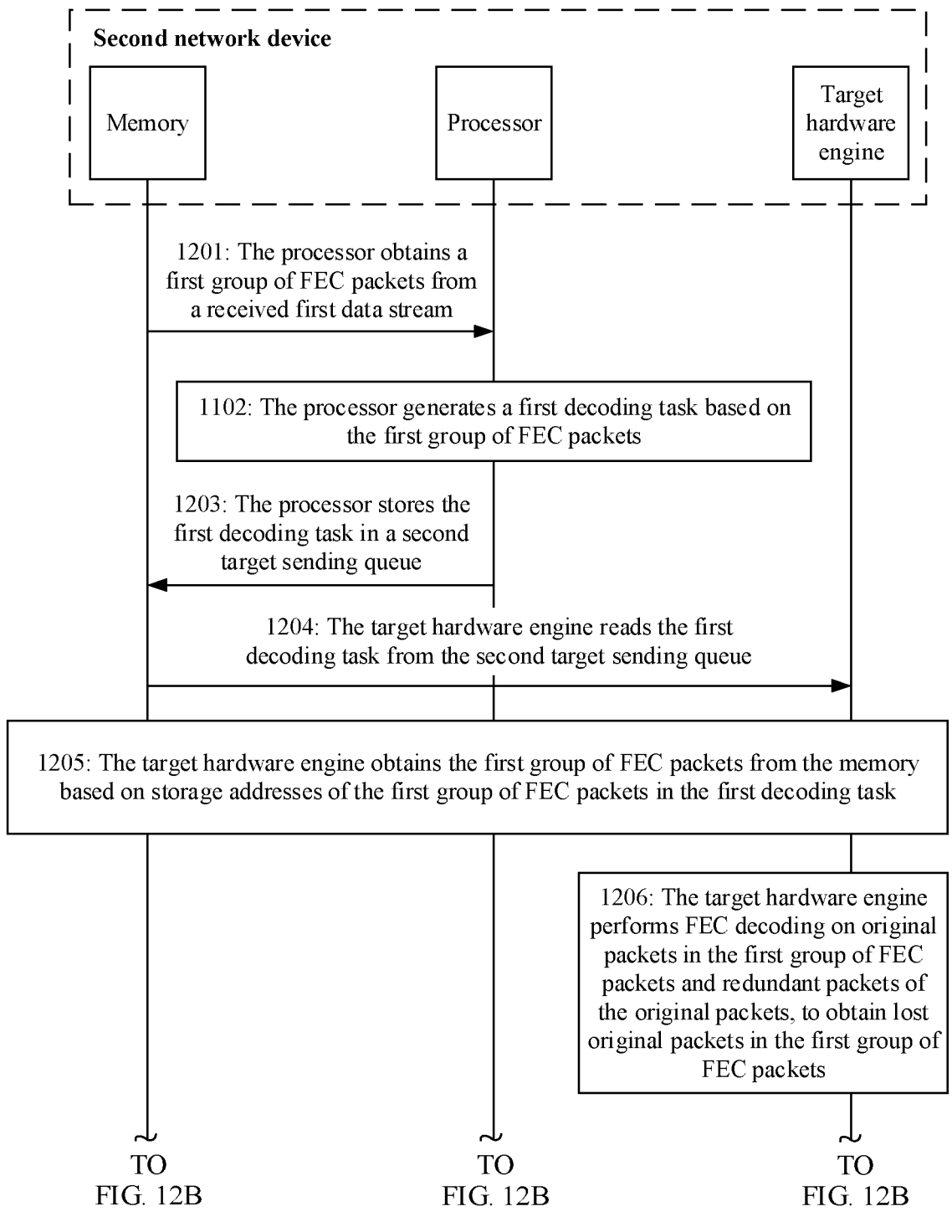
FIG. 12A and FIG. 12B are a flowchart of a packet processing method according to an embodiment of this application.
Figure 12B:
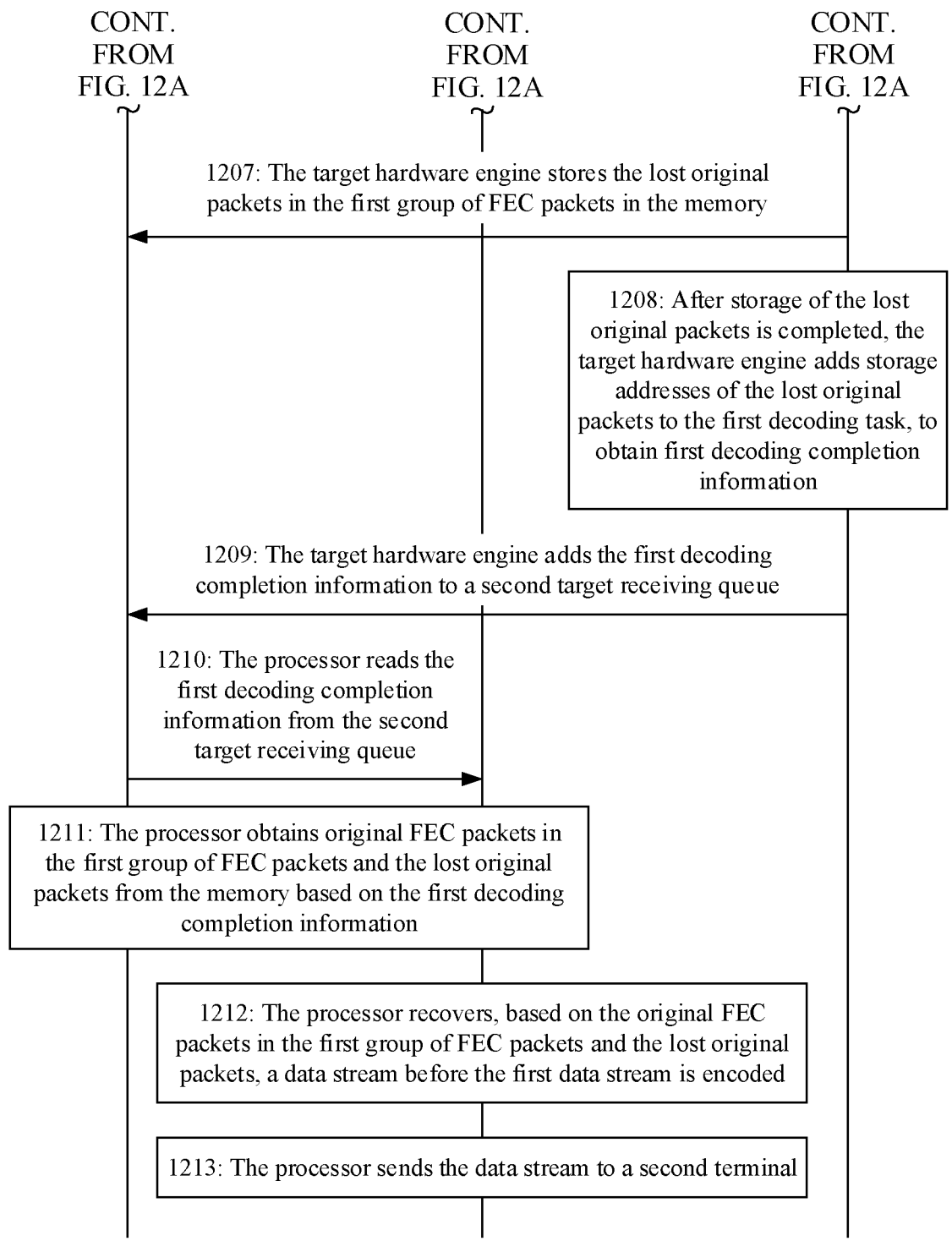

After the second network device obtains the encoding stream, if the original FEC packets in the encoding stream are lost, the second network device may decode the FEC packets that are not lost, to recover the lost FEC packets. A processing process may be as follows. After obtaining any encoding stream, the second network device may store the any encoding stream in the memory. If a quantity of original FEC packets in any group of FEC packets in the any encoding stream is less than the original packet quantity M during encoding, it indicates that a packet loss occurs in the any group of FEC packets in the transmission process. A processor in the second network device may generate a decoding task used to indicate to decode the any group of FEC packets, and the processor may deliver the decoding task to the memory. A target hardware engine in the second network device reads the decoding task in the memory, performs FEC encoding on the any group of FEC packets stored in the memory based on the encoding task, to recover the lost original packets in the any group of FEC packets, and then stores the recovered original packets in the memory. Then, the processor may obtain original FEC packets that are not lost in the any group of FEC packets and the recovered original packets from the memory, and remove FEC packet headers of the original FEC packets that are not lost, to obtain the original packets that are not lost. To further describe the processing process, refer to a flowchart of a packet processing method according to an embodiment of this application shown in FIG. 12A and FIG. 12B. The second network device may include a processor and a target hardware engine, and a procedure of the method includes steps 1201 to 1213.

1201: The processor obtains a first group of FEC packets from a received first data stream, where FEC packet headers of all FEC packets in the first group of FEC packets are the same, and the FEC packet header includes an FEC-encoding original packet quantity M.

The second network device may obtain a plurality of encoding streams, the first data stream may be any encoding stream in the plurality of encoding streams, the first data stream may include a plurality of groups of FEC packets, and the first group of FEC packets is any group of FEC packets in the plurality of groups of FEC packets. The first group of FEC packets includes M original FEC packets and R redundant FEC packets that are output by a first network device after one time of encoding is performed.

When the second network device starts to receive the first data stream, the second network device stores an FEC packet in a memory of the second network device each time the second network device receives the FEC packet in the first data stream. In some possible implementations, a GE/10GE network port of the second network device receives the FEC packet, and sends the FEC packet to a PPE in the second network device. The PPE stores the FEC packet in the memory and records a storage address of the FEC packet, and sends a storage completion message to an NP engine of the second network device, where the storage completion message carries the storage address of the FEC packet. After receiving the storage completion message, the NP engine may send the storage completion message to a protocol stack in a CPU of the second network device. Therefore, a UDP proxy may collect each storage completion message from the protocol stack, send the collected storage completion messages to an FEC software interface of the second network device. The FEC software interface obtains each storage completion message every third preset duration. The FEC software interface reads, based on a storage address carried in each storage completion message, a packet header of an FEC packet at the storage address corresponding to the memory, to obtain a plurality of packet headers. Then, the FEC software interface compares the plurality of packet headers to obtain same packet headers, and determine FEC packets whose packet headers are the same as a group of FEC packets. In other words, for the FEC packets in the first data stream, each time the third preset duration elapses, the second network device uses packets whose FEC packet headers are the same in FEC packets newly stored within the third preset duration as the first group of FEC packets. The third preset duration is not limited in this embodiment of this application. Because the FEC packet headers carry target identifiers, and the target identifiers are used to indicate a quantity of times of encoding. In some possible implementations, when target identifiers in packet headers of a plurality of FEC packets are the same, it may also be indicated that the plurality of FEC packets are packets obtained after a same time of encoding. In other words, the plurality of FEC packets are a group of FEC packets.

1202: When a quantity of original packets in the first group of FEC packets is less than the original packet quantity M, the processor generates a first decoding task based on the first group of FEC packets, where the first decoding task is used to indicate to decode the first group of FEC packets.

Step 1202 may be performed by the FEC software interface in the processor. After the FEC software interface determines the first group of FEC packets, the second network device may obtain encoding parameters from a packet header of one FEC packet in the first group of FEC packets. The original packet quantity M in the encoding parameters is a quantity of original FEC packets initially included in the first group of FEC packets. Because each of the original FEC packets corresponds to one original packet during encoding, when the quantity of original FEC packets in the first group of FEC packets is less than the original packet quantity M, in other words, the quantity of original packets in the first group of FEC packets is less than the original packet quantity M, it indicates that at least one original FEC packet in the first group of FEC packets is lost. In other words, in a process in which the first network device transmits the first group of FEC packets to the second network device, some original FEC packets, namely, original packets during encoding, are lost. To recover the first data stream before encoding, the FEC software interface may generate the first decoding task, so that the target hardware engine decodes FEC packets that are not lost in the first group of FEC packets based on the first decoding task, to recover the lost original FEC packets.

The first decoding task includes storage addresses of the first group of FEC packets or the first group of FEC packets, so that the target hardware engine may obtain the first group of FEC packets from the memory based on the storage address of the first group of FEC packets, or so that the target hardware engine may directly obtain the first group of FEC packets from the first decoding task. When the first data stream has a priority, the first decoding task may further include the priority of the first data stream.

When the quantity of original FEC packets in the plurality of FEC packets is equal to the original packet quantity M in the encoding parameters, it indicates that no original FEC packet in the first group of FEC packets is lost, and the second network device may perform the following step 1211.

1203: The processor stores the first decoding task in a second target sending queue, where the second target sending queue is used to store decoding tasks of to-be-processed data streams of the second network device, and the to-be-processed data streams of the second network device include the first data stream.

Step 1203 may be performed by the FEC software interface in the processor. The to-be-processed data stream in step 1203 is a to-be-processed encoding stream. The second network device may preset a plurality of sending queues. Each of the sending queues is used to store decoding tasks of to-be-processed data streams of the second network device. The second target sending queue may be any one of the plurality of sending queues. The plurality of sending queues may be located in any one of the memory, the processor, and the target hardware engine of the second network device.

In some possible implementations, the second network device may set a priority for each of the sending queues, and each of the sending queues is used to store decoding tasks of data streams whose priorities are the same. In some possible implementations, step 1203 may include the following. The processor adds the first decoding task to the second target sending queue based on the priority of the first data stream, where a priority of the second target sending queue is equal to the priority of the first data stream. A process in which the processor adds the first decoding task to the second target sending queue is the same as a process in which the processor adds the first encoding task to the first target sending queue in step 803. Herein, the specific process of adding the first decoding task to the second target sending queue is not described again in this embodiment of this application.

1204: The target hardware engine reads the first decoding task from the second target sending queue.

The target hardware engine may first poll each of the second sending queues in the memory based on a priority sequence, to determine whether the target hardware engine needs to read the first decoding task from the second target sending queue. In some possible implementations, the target hardware engine sequentially queries, based on the priority sequence of the sending queues, whether there are decoding tasks in each of the sending queues, where each of the sending queues corresponds to one priority. In each of the sending queues, the target hardware engine reads the first decoding task from the second target sending queue when there is no other decoding task in a queue whose priority is higher than that of the second target sending queue.

A process in which the target hardware engine obtains the first decoding task by polling each of the sending queues is the same as a process in which the target hardware engine obtains the first encoding task by polling each of the sending queues in step 804. Herein, the process of obtaining the first decoding task by polling each of the sending queues is not described again in this embodiment of this application.

1205: The target hardware engine obtains the first group of FEC packets from the memory based on the storage addresses of the first group of FEC packets in the first decoding task.

A process shown in step 1205 is the same as a process shown in step 805. Herein, step 1205 is not described again in this embodiment of this application. In some possible implementations, when the first decoding task carries the first group of FEC packets, the target hardware engine may directly obtain the first group of FEC packets from the first decoding task without obtaining the first group of FEC packets from the memory. The first group of FEC packets obtained by the target hardware engine is the FEC packets that are not lost in the first group of FEC packets, and includes original FEC packets that are not lost and redundant FEC packets that are not lost.

1206: The target hardware engine performs FEC decoding on the original packets in the first group of FEC packets and redundant packets of the original packets, to obtain the lost original packets in the first group of FEC packets.

When the target hardware engine obtains the first group of FEC packets, a data processing unit in the target hardware engine may remove packet headers of the original FEC packets and packet headers of the redundant FEC packets from the first group of FEC packets, to obtain a plurality of equal-length packets and at least one redundant packet. Each of the equal-length packets is an original packet lost in the first group of FEC packets. The data processing unit may form a recovery matrix by using the plurality of equal-length packets and the at least one redundant packet, and send the recovery matrix to an encoding and decoding unit. A matrix generator constructs a corresponding target check matrix, and sends the corresponding target check matrix to the encoding and decoding unit. The encoding and decoding unit performs multiplication calculation on an inverse matrix of the corresponding target check matrix and the recovery matrix, to obtain a to-be-encoded matrix, determines, based on a sequence number of each of the equal-length packets in the FEC packet headers and a sequence number of each of the redundant packets, which equal-length packets are lost and which redundant packets are lost, in other words, which original FEC packets are lost or which redundant FEC packets are lost. Therefore, the lost equal-length packets may be obtained from the to-be-encoded matrix, to obtain the lost original packets and implement step 1206. FIG. 2 describes a multiplication calculation process of the inverse matrix of the target check matrix and the recovery matrix. Herein, the process is not described again in this embodiment of this application.

A process in which the matrix generator constructs the corresponding target check matrix is as follows. A controller in the target hardware engine determines a quantity of lost redundant FEC packets based on a redundant packet quantity R in the encoding parameters in the packet headers, where the quantity of lost redundant FEC packets is a difference between the redundant packet quantity R and a quantity of redundant FEC packets in the plurality of FEC packets. The controller determines the quantity of lost original FEC packets based on the original packet quantity M in the encoding parameters in the FEC packet headers and the quantity of original FEC packets in the plurality of FEC packets, where the quantity of lost original FEC packets is a difference between the original packet quantity M and the quantity of original FEC packets in the plurality of FEC packets. The controller sends the quantity of lost redundant FEC packets and the quantity of lost original FEC packets to the matrix generator. The matrix generator constructs the corresponding target check matrix based on the quantity of lost redundant FEC packets and the quantity of lost original FEC packets, and sends the corresponding target check matrix to the encoding and decoding unit.

A process shown in steps 1205 and 1206 is a process of performing FEC decoding on the original packets in the first group of FEC packets and the redundant packets of the original packets based on the first decoding task, to obtain the lost original packets in the first group of FEC packets.

1207: The target hardware engine stores the lost original packets in the first group of FEC packets in the memory.

A process shown in step 1207 is the same as a process shown in step 807. Herein, step 1207 is not described again in this embodiment of this application.

1208: After storage of the lost original packets is completed, the target hardware engine adds storage addresses of the lost original packets to the first decoding task, to obtain first decoding completion information, where the first encoding completion information is used to indicate that decoding of the first group of FEC packets is completed.

The first decoding completion information carries the storage addresses of the lost original packets and the original FEC packets in the first group of FEC packets. When the first data stream has the priority, the first decoding completion information further carries the priority of the first data stream. A process shown in step 1208 is the same as a process of generating the first encoding completion information in step 808. Herein, step 1208 is not described again in this embodiment of this application.

1209: The target hardware engine adds the first decoding completion information to a second target receiving queue, where the second target receiving queue is used to store decoding completion information of to-be-processed encoding streams of the second network device.

The second network device may preset a plurality of receiving queues. Each of the receiving queues is used to store decoding completion information of to-be-processed encoding streams of the second network device. The second target receiving queue may be any one of the plurality of receiving queues. The plurality of receiving queues may be located in any one of the memory, the processor, and the target hardware engine of the second network device.

In some possible implementations, the second network device may set a priority for each of the receiving queues. In some possible implementations, the first decoding completion information is added to the second target receiving queue in the memory based on a priority of the encoding stream, where a priority of the second target receiving queue is equal to the priority of the encoding stream. A specific addition process is the same as a process of adding the first encoding completion information to the first target receiving queue in step 809.

1210: The processor reads the first decoding completion information from the second target receiving queue.

Step 1210 may be performed by the FEC software interface in the processor. The FEC software interface may poll second receiving queues based on a priority sequence. The FEC software interface may first determine, in a polling manner, whether the first decoding completion information can be obtained from the second target receiving queue. In some possible implementations, the FEC software interface sequentially queries, based on the priority sequence, whether each of the second receiving queues has other decoding completion information, where each of the second receiving queues corresponds to one priority. In each of the second receiving queues, the FEC software interface obtains the decoding completion information from the second target receiving queue when there is no other decoding completion information in a queue whose priority is higher than that of the second target receiving queue. A process in which the FEC software interface polls each of the receiving queues in step 1210 is the same as a process in which the FEC software interface polls each of receiving queues in step 810.

1211: The processor obtains the original FEC packets in the first group of FEC packets and the lost original packets from the memory based on the first decoding completion information.

A process shown in step 1211 is the same as a process of obtaining the M original packets and the R redundant packets in step 811. Herein, step 1211 is not described again in this embodiment of this application.

1212: The processor recovers, based on the original FEC packets in the first group of FEC packets and the lost original packets, a data stream before the first data stream is encoded.

Step 1212 may be performed by the FEC software interface in the processor. The FEC software interface may first remove the packet headers of the original FEC packets that are not lost in the first group of FEC packets, to obtain the plurality of equal-length packets, and then recover, based on the plurality of equal-length packets and the lost original packets, the data stream before the first data stream is encoded. In some possible implementations, step 1212 may be implemented by using a process shown in the following steps 12A to 12C.

Step 12A: For the original FEC packets in the first group of FEC packets, the FEC software interface removes the FEC packet header of each of the original FEC packets, to obtain the plurality of equal-length packets.

Step 12B: The FEC software interface removes the plurality of equal-length packets and data padded in the lost original packets, to obtain the M original packets in the data stream before the first data stream is encoded.

Step 12C: The FEC software interface sorts the M original packets based on a sequence number of each of the original packets that is carried in the FEC packet header, to obtain the data stream before the first data stream is encoded.

1213: The processor sends the data stream to a second terminal.

Step 1213 is similar to step 8123. Herein, step 1213 is not described again in this embodiment of this application.

Figure 13:
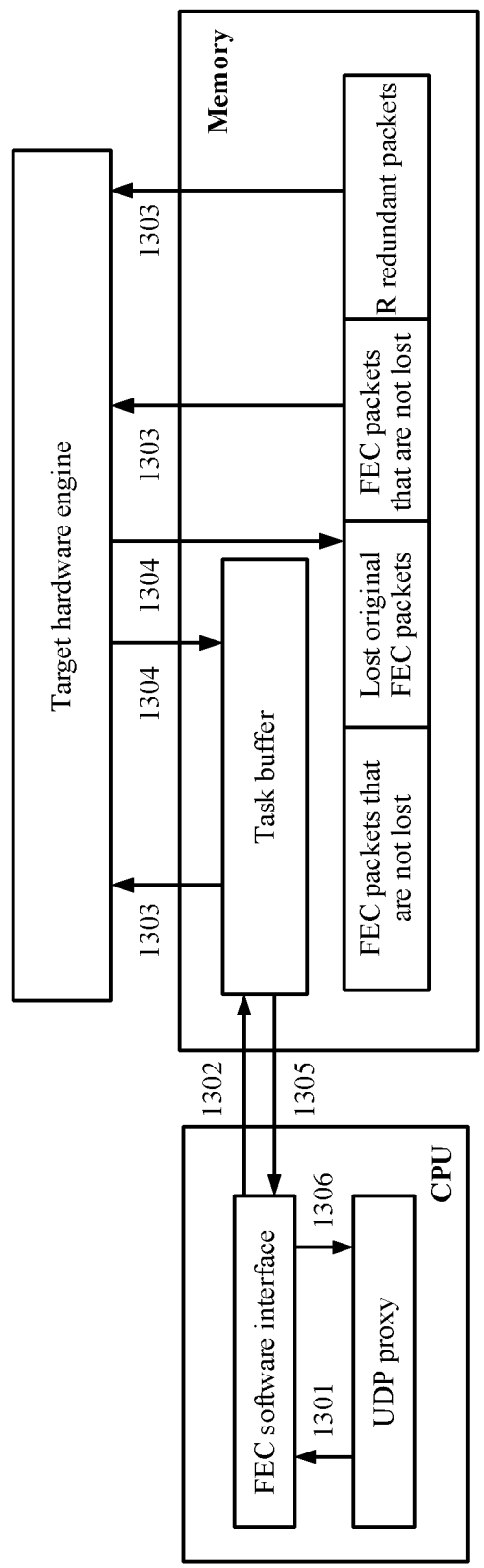
FIG. 13 is a flowchart of FEC decoding according to an embodiment of this application.

To further describe an interaction status between the processor, the target hardware engine, and the memory in the second network device in the decoding process, refer to a flowchart of FEC decoding according to an embodiment of this application shown in FIG. 13. A procedure includes steps 1301 to 1306.

Step 1301: The UDP proxy sends a storage completion message of each of the FEC packets to the FEC software interface.

Step 1302: After receiving a storage completion message of a group of FEC packets, if original FEC packets are lost in the group of FEC packets, the FEC software interface generates the first decoding task based on the received group of FEC packets, and sends the first decoding task to a task buffer of the memory.

The task buffer includes a plurality of sending queues and a plurality of receiving queues, and the FEC software interface may send the first decoding task to the second target sending queue corresponding to the priority of the first decoding task.

Step 1303: The target hardware engine obtains the first decoding task from the second target sending queue in the task buffer, and reads the group of FEC packets from the memory based on storage addresses in the first decoding task.

Step 1304: The target hardware engine decodes the read group of FEC packets to obtain lost original packets, stores the lost original packets in the memory, and adds the first decoding completion information to the second target receiving queue in the memory.

Step 1305: The FEC software interface reads the first decoding completion information from the second target receiving queue in the task buffer, reads the group of FEC packets and the lost original packets in the memory based on the first decoding completion information, and removes packet headers of the group of FEC packets to obtain equal-length packets.

Step 1306: The FEC software interface processes the equal-length packets to obtain a data stream, and outputs the data stream.

A process shown in steps 1207 to 1213 is a process in which the target hardware engine, the memory, and the processor collaboratively send the data stream to the second terminal. In some possible implementations, the target hardware engine may further directly send the first group of FEC packets and the lost original packets to the processor, and the processor performs the process shown in 1212 and 1213. In some possible implementations, the target hardware engine may alternatively perform the process shown in 1212 and 1213.

According to the method provided in this embodiment of this application, FEC decoding is directly performed on the FEC packets that are not lost in the first group of FEC packets in the target hardware engine of the second network device rather than in the CPU. Therefore, CPU overheads can be reduced, and decoding efficiency of the second network device can be improved. In this way, the second network device can easily meet a requirement of a large throughput in a packet transmission process.

All of the foregoing optional technical solutions may form optional embodiments of this disclosure through any combination. Herein, details are not described herein again.

When the packet processing apparatus provided in the foregoing embodiments of this application performs packet processing, division into the foregoing function modules is merely used as an example for illustration. In actual application, the foregoing functions may be allocated to different function modules and implemented based on a requirement, that is, an inner structure of the apparatus is divided into different function modules to complete all or some of the functions described above. In addition, the packet processing apparatus provided in the foregoing embodiments and the packet processing method embodiments provided in the foregoing embodiments pertain to a same concept. For a specific implementation process of the apparatus, refer to the method embodiments. Details are not described herein again.

A person of ordinary skill in the art may understand that all or some of the steps of the embodiments may be implemented by hardware or a program instructing related hardware. The program may be stored in a computer-readable storage medium. The storage medium may include a read-only memory, a magnetic disk, an optical disc, or the like.

The foregoing descriptions are merely embodiments of this application, but are not intended to limit this application. Any modification, equivalent replacement, or improvement made without departing from the principle of this application should fall within the protection scope of this application.

What is claimed is:

1. A packet processing method implemented by a network device, wherein the packet processing method comprises:
generating, by a processor of the network device, a first encoding task based on M original packets in a to-be-processed first data stream, wherein M is a positive integer, and wherein the first encoding task instructs to encode the M original packets; and
performing, by a target hardware engine of the network device and based on the first encoding task, forward error correction (FEC) encoding on the M original packets to obtain R redundant packets,
wherein R is a positive integer.

2. The packet processing method of claim 1, wherein after generating the first encoding task, the packet processing method further comprises:
storing, by the processor, the first encoding task in a target sending queue, wherein the target sending queue stores second encoding tasks of to-be-processed data streams of the network device, and wherein the to-be-processed data streams comprise the to-be-processed first data stream; and
reading, by the target hardware engine and from the target sending queue, the first encoding task.

3. The packet processing method of claim 2, further comprising adding, by the processor, the first encoding task to the target sending queue based on a first priority of the to-be-processed first data stream, wherein a second priority of the target sending queue is equal to the first priority.

4. The packet processing method of claim 2, further comprising:
sequentially querying, by the target hardware engine and based on a priority sequence of sending queues, whether there are third encoding tasks in each of the sending queues, wherein each of the sending queues corresponds to one priority; and
further reading, by the target hardware engine from the target sending queue, the first encoding task when a queue comprising a first priority that is higher than a second priority of the target sending queue in the sending queues does not comprise a fourth encoding task.

5. The packet processing method of claim 1, wherein before generating the first encoding task, the packet processing method further comprises:
receiving, by the processor, first original packets;
storing, by the processor, the first original packets in the to-be-processed first data stream in a memory of the network device; and
identifying, by the processor, that a quantity of unencoded original packets in the to-be-processed first data stream is greater than or equal to M; and
obtaining, by the processor, from the unencoded original packets, and in response to identifying, the M original packets.

6. The packet processing method of claim 1, wherein the first encoding task comprises storage addresses of the M original packets.

7. The packet processing method of claim 1, wherein the first encoding task comprises storage addresses of the M original packets and a priority of the to-be-processed first data stream.

8. The packet processing method of claim 1, wherein the first encoding task comprises the M original packets or the M original packets and comprises a priority of the to-be-processed first data stream.

9. A packet processing method implemented by a network device, wherein the packet processing method comprises:
   obtaining, by a processor of the network device, a first group of forward error correction (FEC) packets from a first data stream, wherein the FEC packets have a first FEC packet header, and wherein the first FEC packet header comprises an FEC-encoding original packet quantity;
   generating, by the processor, a first decoding task based on the first group when a quantity of original packets in the first group is less than the FEC-encoding original packet quantity, wherein the first decoding task instructs to decode the first group; and
   performing, by a target hardware engine of the network device and based on the first decoding task, FEC decoding on the original packets and redundant packets of the original packets to obtain lost original packets in the first group.

10. The packet processing method of claim 9, wherein after generating the first decoding task, the packet processing method further comprises:
    storing, by the processor, the first decoding task in a target sending queue, wherein the target sending queue stores second decoding tasks of to-be-processed data streams of the network device, and wherein the to-be-processed data streams comprise the first data stream; and
    reading, by the target hardware engine and from the target sending queue, the first decoding task.

11. The packet processing method of claim 10, further comprising adding, by the processor, the first decoding task to the target sending queue based on a first priority of the first data stream, wherein a second priority of the target sending queue is equal to the first priority.

12. The packet processing method of claim 10, further comprising:
    sequentially querying, by the target hardware engine based on a priority sequence of sending queues, whether there are third decoding tasks in each of the sending queues, wherein each of the sending queues corresponds to one priority; and
    further reading, by the target hardware engine and from the target sending queue, the first decoding task when a queue comprising a first priority that is higher than a second priority of the target sending queue in the sending queues does not comprise a fourth decoding task.

13. A packet processing apparatus comprising:
    a processor configured to generate a first encoding task based on M original packets in a to-be-processed first data stream, wherein M is a positive integer, and wherein the first encoding task instructs to encode the M original packets; and
    a target hardware engine coupled to the processor and configured to perform, based on the first encoding task, forward error correction (FEC) encoding on the M original packets to obtain R redundant packets, wherein R is a positive integer.

14. The packet processing apparatus of claim 13, wherein the processor is further configured to store the first encoding task in a target sending queue, wherein the target sending queue stores second encoding tasks of to-be-processed data streams of the packet processing apparatus, wherein the to-be-processed data streams comprise the to-be-processed first data stream, and wherein the target hardware engine is further configured to read, from the target sending queue, the first encoding task.

15. The packet processing apparatus of claim 14, wherein the processor is further configured to add the first encoding task to the target sending queue based on a first priority of the first data stream, and wherein a second priority of the target sending queue is equal to the first priority.

16. The packet processing apparatus of claim 15, wherein the target hardware engine is configured to:
    sequentially query, based on a priority sequence of sending queues, whether there are third encoding tasks in each of the sending queues, wherein each of the sending queues corresponds to one priority; and
    further read, from the target sending queue, the first encoding task when a queue comprising a first priority that is higher than a second priority of the target sending queue in the sending queues does not comprise a fourth encoding task.

17. A packet processing apparatus comprising:
    a processor configured to:
       obtain a first group of forward error correction (FEC) packets from a first data stream, wherein FEC packets in the first group have a first FEC packet header, and wherein the first FEC packet header comprises an FEC-encoding original packet quantity; and
       generate a first decoding task based on the first group when a quantity of original packets in the first group is less than the FEC-encoding original packet quantity, wherein the first decoding task instructs to decode the first group; and
    a target hardware engine coupled to the processor and configured to perform, based on the first decoding task, FEC decoding on the original packets and redundant packets of the original packets to obtain lost original packets in the first group.

18. The packet processing apparatus of claim 17, wherein the processor is further configured to store the first decoding task in a target sending queue, wherein the target sending queue stores second decoding tasks of to-be-processed data streams of the packet processing apparatus, wherein the to-be-processed data streams comprise the first data stream, and wherein the target hardware engine is further configured to read, from the target sending queue, the first decoding task.

19. The packet processing apparatus of claim 18, wherein the processor is further configured to add the first decoding task to the target sending queue based on a first priority of the first data stream, and wherein a second priority of the target sending queue is equal to the first priority.

20. The packet processing apparatus of claim 18, wherein the target hardware engine is configured to:
    sequentially query, based on a priority sequence of sending queues, whether there are third decoding tasks in each of the sending queues, wherein each of the sending queues corresponds to one priority; and
    further read, from the target sending queue, the first decoding task when a queue comprising a first priority that is higher than a second priority of the target sending queue in the sending queues does not comprise a fourth decoding task.

* * * * *